(12) United States Patent
Chung

(10) Patent No.: US 9,076,526 B2
(45) Date of Patent: Jul. 7, 2015

(54) OTP MEMORIES FUNCTIONING AS AN MTP MEMORY

(71) Applicant: Shine C. Chung, San Jose, CA (US)

(72) Inventor: Shine C. Chung, San Jose, CA (US)

(*) Notice: Subject to any disclaimer, the term of this patent is extended or adjusted under 35 U.S.C. 154(b) by 28 days.

(21) Appl. No.: 14/021,990

(22) Filed: Sep. 9, 2013

(65) Prior Publication Data

US 2014/0071726 A1 Mar. 13, 2014

Related U.S. Application Data

(60) Provisional application No. 61/699,255, filed on Sep. 10, 2012.

(51) Int. Cl.
| G11C 15/00 | (2006.01) |
| G11C 15/04 | (2006.01) |
| G11C 17/08 | (2006.01) |
| G11C 17/16 | (2006.01) |

(52) U.S. Cl.
CPC .............. *G11C 15/04* (2013.01); *G11C 17/08* (2013.01); *G11C 17/16* (2013.01)

(58) Field of Classification Search
CPC .......... H01L 27/11206; G11C 15/046; G11C 2213/79
USPC ........................................ 365/49.1–49.18, 94
See application file for complete search history.

(56) References Cited

U.S. PATENT DOCUMENTS

| 3,198,670 A | 8/1965 | Nissim |
| 3,715,242 A | 2/1973 | Daniel |
| 4,148,046 A | 4/1979 | Hendrickson et al. |
| 4,192,059 A | 3/1980 | Khan et al. |
| 4,642,674 A | 2/1987 | Schoofs |
| 5,192,989 A | 3/1993 | Matsushita et al. |
| 5,389,552 A | 2/1995 | Iranmanesh |
| 5,447,876 A | 9/1995 | Moyer et al. |

(Continued)

FOREIGN PATENT DOCUMENTS

| CN | 1469473 A | 1/2004 |
| CN | 1691204 A | 11/2005 |

(Continued)

OTHER PUBLICATIONS

U.S. Appl. No. 13/471,704, filed May 15, 2012.

(Continued)

*Primary Examiner* — Alexander Sofocleous
*Assistant Examiner* — Muhammad Islam

(57) ABSTRACT

Techniques, systems and circuitry for using One-Time Programmable (OTP) memories to function as a Multiple-Time Programmable (MTP) memory. The OTP-for-MTP memory can include at least one OTP data memory to store data, and at least one OTP CAM to store addresses and to search input address through valid entries of the OTP CAM to find a latest entry of the matched valid addresses. The OTP-for-MTP memory can also include a valid-bit memory to find a next available entry of the OTP data memory and OTP CAM. When programming the OTP-for-MTP memory, address and data can be both programmed into the next available entry of the OTP CAM and the OTP data memory, respectively. When reading the OTP-for-MTP memory, the input address can be used to compare with valid entries of the addresses stored in the OTP CAM so that the latest entry of the matched valid addresses can be output.

21 Claims, 11 Drawing Sheets

(56) References Cited

U.S. PATENT DOCUMENTS

| | | |
|---|---|---|
| 5,635,742 A | 6/1997 | Hoshi et al. |
| 5,637,901 A | 6/1997 | Beigel et al. |
| 5,723,890 A | 3/1998 | Fujihira et al. |
| 5,757,046 A | 5/1998 | Fujihira et al. |
| 5,761,148 A | 6/1998 | Allan et al. |
| 5,962,903 A | 10/1999 | Sung et al. |
| 6,008,092 A | 12/1999 | Gould |
| 6,034,882 A | 3/2000 | Johnson et al. |
| 6,054,344 A | 4/2000 | Liang et al. |
| 6,140,687 A | 10/2000 | Shimomura et al. |
| 6,243,864 B1 | 6/2001 | Odani et al. |
| 6,249,472 B1 | 6/2001 | Tamura et al. |
| 6,346,727 B1 | 2/2002 | Ohtomo |
| 6,400,540 B1 | 6/2002 | Chang |
| 6,405,160 B1 | 6/2002 | Djaja et al. |
| 6,461,934 B2 | 10/2002 | Nishida et al. |
| 6,483,734 B1 | 11/2002 | Sharma et al. |
| 6,597,629 B1 | 7/2003 | Raszka et al. |
| 6,611,043 B2 | 8/2003 | Takiguchi |
| 6,731,535 B1 | 5/2004 | Ooishi et al. |
| 6,770,953 B2 | 8/2004 | Boeck et al. |
| 6,803,804 B2 | 10/2004 | Madurawe |
| 6,813,705 B2 | 11/2004 | Duesterwald et al. |
| 6,944,083 B2 | 9/2005 | Pedlow |
| 6,967,879 B2 | 11/2005 | Mizukoshi |
| 7,009,182 B2 | 3/2006 | Kannan et al. |
| 7,211,843 B2 | 5/2007 | Low et al. |
| 7,212,432 B2 | 5/2007 | Ferrant et al. |
| 7,224,598 B2 | 5/2007 | Perner |
| 7,263,027 B2 | 8/2007 | Kim et al. |
| 7,294,542 B2 | 11/2007 | Okushima |
| 7,391,064 B1 | 6/2008 | Tripsas et al. |
| 7,411,844 B2 | 8/2008 | Nitzan et al. |
| 7,439,608 B2 | 10/2008 | Arendt |
| 7,461,371 B2 | 12/2008 | Luo et al. |
| 7,573,762 B2 | 8/2009 | Kenkare et al. |
| 7,589,367 B2 | 9/2009 | Oh et al. |
| 7,660,181 B2 | 2/2010 | Kumar et al. |
| 7,696,017 B1 | 4/2010 | Tripsas et al. |
| 7,701,038 B2 | 4/2010 | Chen et al. |
| 7,764,532 B2 | 7/2010 | Kurjanowicz et al. |
| 7,802,057 B2 | 9/2010 | Iyer et al. |
| 7,808,815 B2 | 10/2010 | Ro et al. |
| 7,833,823 B2 | 11/2010 | Klersy |
| 7,859,920 B2 | 12/2010 | Jung |
| 7,889,204 B2 | 2/2011 | Hansen et al. |
| 7,910,999 B2 | 3/2011 | Lee et al. |
| 8,008,723 B2 | 8/2011 | Nagai |
| 8,050,129 B2 | 11/2011 | Liu et al. |
| 8,089,137 B2 | 1/2012 | Lung et al. |
| 8,115,280 B2 | 2/2012 | Chen et al. |
| 8,119,048 B2 | 2/2012 | Nishimura |
| 8,168,538 B2 | 5/2012 | Chen et al. |
| 8,174,063 B2 | 5/2012 | Liu et al. |
| 8,174,922 B2 | 5/2012 | Naritake |
| 8,179,711 B2 | 5/2012 | Kim et al. |
| 8,183,665 B2 | 5/2012 | Bertin et al. |
| 8,217,490 B2 | 7/2012 | Bertin et al. |
| 8,233,316 B2 | 7/2012 | Liu et al. |
| 8,339,079 B2 | 12/2012 | Tamada |
| 8,369,166 B2 | 2/2013 | Kurjanowicz et al. |
| 8,373,254 B2 | 2/2013 | Chen et al. |
| 8,380,768 B2 | 2/2013 | Hoefler |
| 8,415,764 B2 | 4/2013 | Chung |
| 8,482,972 B2 | 7/2013 | Chung |
| 8,488,359 B2 | 7/2013 | Chung |
| 8,488,364 B2 | 7/2013 | Chung |
| 8,514,606 B2 | 8/2013 | Chung |
| 8,526,254 B2 | 9/2013 | Kurjanowicz et al. |
| 8,559,208 B2 | 10/2013 | Chung |
| 8,570,800 B2 | 10/2013 | Chung |
| 8,576,602 B2 | 11/2013 | Chung |
| 8,643,085 B2 | 2/2014 | Pfirsch |
| 8,644,049 B2 | 2/2014 | Chung |
| 8,648,349 B2 | 2/2014 | Masuda et al. |
| 8,649,203 B2 | 2/2014 | Chung |
| 8,760,904 B2 | 6/2014 | Chung |
| 8,817,563 B2 | 8/2014 | Chung |
| 8,830,720 B2 | 9/2014 | Chung |
| 8,854,859 B2 | 10/2014 | Chung |
| 8,861,249 B2 | 10/2014 | Chung |
| 8,913,415 B2 | 12/2014 | Chung |
| 8,913,449 B2 | 12/2014 | Chung |
| 8,923,085 B2 | 12/2014 | Chung |
| 8,988,965 B2 | 3/2015 | Chung |
| 9,019,742 B2 | 4/2015 | Chung |
| 9,019,791 B2 | 4/2015 | Chung |
| 9,025,357 B2 | 5/2015 | Chung |
| 2002/0168821 A1 | 11/2002 | Williams et al. |
| 2002/0196659 A1 | 12/2002 | Hurst et al. |
| 2003/0104860 A1 | 6/2003 | Cannon et al. |
| 2003/0135709 A1 | 7/2003 | Niles et al. |
| 2003/0169625 A1 | 9/2003 | Hush et al. |
| 2004/0057271 A1 | 3/2004 | Parkinson |
| 2004/0113183 A1 | 6/2004 | Karpov et al. |
| 2004/0130924 A1* | 7/2004 | Ma et al. ............... 365/49 |
| 2005/0060500 A1 | 3/2005 | Luo et al. |
| 2005/0062110 A1 | 3/2005 | Dietz et al. |
| 2005/0110081 A1 | 5/2005 | Pendharkar |
| 2005/0124116 A1 | 6/2005 | Hsu et al. |
| 2005/0146962 A1 | 7/2005 | Schreck |
| 2006/0072357 A1 | 4/2006 | Wicker |
| 2006/0092689 A1 | 5/2006 | Braun et al. |
| 2006/0104111 A1 | 5/2006 | Tripsas et al. |
| 2006/0120148 A1 | 6/2006 | Kim et al. |
| 2006/0129782 A1 | 6/2006 | Bansal et al. |
| 2006/0215440 A1 | 9/2006 | Cho et al. |
| 2006/0244099 A1 | 11/2006 | Kurjanowicz |
| 2007/0057323 A1 | 3/2007 | Furukawa et al. |
| 2007/0081377 A1 | 4/2007 | Zheng et al. |
| 2007/0133341 A1 | 6/2007 | Lee et al. |
| 2007/0138549 A1 | 6/2007 | Wu et al. |
| 2007/0223266 A1 | 9/2007 | Chen |
| 2007/0279978 A1 | 12/2007 | Ho et al. |
| 2008/0025068 A1 | 1/2008 | Scheuerlein et al. |
| 2008/0028134 A1 | 1/2008 | Matsubara et al. |
| 2008/0044959 A1 | 2/2008 | Cheng et al. |
| 2008/0067601 A1 | 3/2008 | Chen |
| 2008/0105878 A1 | 5/2008 | Ohara |
| 2008/0151612 A1 | 6/2008 | Pellizzer et al. |
| 2008/0170429 A1 | 7/2008 | Bertin et al. |
| 2008/0175060 A1 | 7/2008 | Liu et al. |
| 2008/0220560 A1 | 9/2008 | Klersy |
| 2008/0225567 A1 | 9/2008 | Burr et al. |
| 2008/0280401 A1 | 11/2008 | Burr et al. |
| 2009/0055617 A1 | 2/2009 | Bansal et al. |
| 2009/0168493 A1 | 7/2009 | Kim et al. |
| 2009/0172315 A1 | 7/2009 | Iyer et al. |
| 2009/0180310 A1 | 7/2009 | Shimomura et al. |
| 2009/0194839 A1 | 8/2009 | Bertin et al. |
| 2009/0213660 A1 | 8/2009 | Pikhay et al. |
| 2009/0219756 A1 | 9/2009 | Schroegmeier et al. |
| 2009/0309089 A1 | 12/2009 | Hsia et al. |
| 2010/0027326 A1 | 2/2010 | Kim et al. |
| 2010/0085798 A1 | 4/2010 | Lu et al. |
| 2010/0091546 A1 | 4/2010 | Liu et al. |
| 2010/0142254 A1 | 6/2010 | Choi et al. |
| 2010/0157651 A1 | 6/2010 | Kumar et al. |
| 2010/0171086 A1 | 7/2010 | Lung et al. |
| 2010/0232203 A1 | 9/2010 | Chung et al. |
| 2010/0238701 A1 | 9/2010 | Tsukamoto et al. |
| 2010/0246237 A1 | 9/2010 | Borot et al. |
| 2010/0277967 A1 | 11/2010 | Lee et al. |
| 2010/0301304 A1 | 12/2010 | Chen et al. |
| 2011/0022648 A1 | 1/2011 | Harris et al. |
| 2011/0128772 A1 | 6/2011 | Kim et al. |
| 2011/0145777 A1 | 6/2011 | Iyer et al. |
| 2011/0175199 A1 | 7/2011 | Lin et al. |
| 2011/0222330 A1 | 9/2011 | Lee et al. |
| 2011/0260289 A1 | 10/2011 | Oyamada |
| 2011/0297912 A1 | 12/2011 | Samachisa et al. |
| 2011/0312166 A1 | 12/2011 | Yedinak et al. |
| 2012/0032303 A1 | 2/2012 | Elkareh et al. |
| 2012/0044736 A1 | 2/2012 | Chung |

(56) References Cited

U.S. PATENT DOCUMENTS

| | | | |
|---|---|---|---|
| 2012/0044737 A1 | 2/2012 | Chung | |
| 2012/0044738 A1 | 2/2012 | Chung | |
| 2012/0044739 A1 | 2/2012 | Chung | |
| 2012/0044740 A1 | 2/2012 | Chung | |
| 2012/0044743 A1 | 2/2012 | Chung | |
| 2012/0044744 A1 | 2/2012 | Chung | |
| 2012/0044745 A1 | 2/2012 | Chung | |
| 2012/0044746 A1 | 2/2012 | Chung | |
| 2012/0044747 A1 | 2/2012 | Chung | |
| 2012/0044748 A1 | 2/2012 | Chung | |
| 2012/0044753 A1 | 2/2012 | Chung | |
| 2012/0044756 A1 | 2/2012 | Chung | |
| 2012/0044757 A1 | 2/2012 | Chung | |
| 2012/0044758 A1 | 2/2012 | Chung | |
| 2012/0047322 A1* | 2/2012 | Chung | 711/103 |
| 2012/0074460 A1 | 3/2012 | Kitagawa | |
| 2012/0106231 A1 | 5/2012 | Chung | |
| 2012/0147653 A1 | 6/2012 | Chung | |
| 2012/0147657 A1 | 6/2012 | Sekar et al. | |
| 2012/0209888 A1 | 8/2012 | Chung | |
| 2012/0224406 A1 | 9/2012 | Chung | |
| 2012/0256292 A1 | 10/2012 | Yu et al. | |
| 2012/0287730 A1 | 11/2012 | Kim | |
| 2012/0314472 A1 | 12/2012 | Chung | |
| 2012/0314473 A1 | 12/2012 | Chung | |
| 2012/0320656 A1 | 12/2012 | Chung | |
| 2012/0320657 A1 | 12/2012 | Chung | |
| 2013/0148409 A1 | 6/2013 | Chung | |
| 2013/0189829 A1 | 7/2013 | Mieczkowski et al. | |
| 2013/0200488 A1 | 8/2013 | Chung | |
| 2013/0201745 A1 | 8/2013 | Chung | |
| 2013/0201746 A1 | 8/2013 | Chung | |
| 2013/0201748 A1 | 8/2013 | Chung | |
| 2013/0201749 A1 | 8/2013 | Chung | |
| 2013/0215663 A1 | 8/2013 | Chung | |
| 2013/0235644 A1 | 9/2013 | Chung | |
| 2013/0268526 A1 | 10/2013 | John et al. | |
| 2014/0010032 A1 | 1/2014 | Seshadri et al. | |
| 2014/0016394 A1 | 1/2014 | Chung et al. | |
| 2014/0071726 A1 | 3/2014 | Chung | |
| 2014/0124871 A1 | 5/2014 | Ko et al. | |
| 2014/0124895 A1 | 5/2014 | Salzman et al. | |
| 2014/0131710 A1 | 5/2014 | Chung | |
| 2014/0131711 A1 | 5/2014 | Chung | |
| 2014/0131764 A1 | 5/2014 | Chung | |
| 2014/0133056 A1 | 5/2014 | Chung | |
| 2014/0211567 A1 | 7/2014 | Chung | |
| 2014/0269135 A1 | 9/2014 | Chung | |
| 2015/0021543 A1 | 1/2015 | Chung | |
| 2015/0078060 A1 | 3/2015 | Chung | |

FOREIGN PATENT DOCUMENTS

| | | |
|---|---|---|
| CN | 101057330 A | 10/2007 |
| CN | 101083227 A | 12/2007 |
| CN | 101188140 A | 5/2008 |
| CN | 101271881 A | 9/2008 |
| CN | 101483062 A | 7/2009 |
| CN | 101728412 A | 6/2010 |
| EP | 1367596 A1 | 12/2003 |
| JP | 03-264814 | 11/1991 |
| TW | I309081 | 10/2007 |

OTHER PUBLICATIONS

U.S. Appl. No. 13/026,650, filed Feb. 14, 2011.
U.S. Appl. No. 13/026,656, filed Feb. 14, 2011.
U.S. Appl. No. 13/026,664, filed Feb. 14, 2011.
U.S. Appl. No. 13/026,678, filed Feb. 14, 2011.
U.S. Appl. No. 13/026,692, filed Feb. 14, 2011.
U.S. Appl. No. 13/026,704, filed Feb. 14, 2011.
U.S. Appl. No. 13/026,717, filed Feb. 14, 2011.
U.S. Appl. No. 13/026,725, filed Feb. 14, 2011.
U.S. Appl. No. 13/026,752, filed Feb. 14, 2011.
U.S. Appl. No. 13/026,771, filed Feb. 14, 2011.
U.S. Appl. No. 13/026,783, filed Feb. 14, 2011.
U.S. Appl. No. 13/026,835, filed Feb. 14, 2011.
U.S. Appl. No. 13/026,840, filed Feb. 14, 2011.
U.S. Appl. No. 13/026,852, filed Feb. 14, 2011.
U.S. Appl. No. 13/214,198, filed Aug. 21, 2011.
U.S. Appl. No. 13/590,044, filed Aug. 20, 2012.
U.S. Appl. No. 13/590,047, filed Aug. 20, 2012.
U.S. Appl. No. 13/590,049, filed Aug. 20, 2012.
U.S. Appl. No. 13/590,050, filed Aug. 20, 2012.
U.S. Appl. No. 13/214,183, filed Aug. 20, 2011.
U.S. Appl. No. 13/288,843, filed Nov. 3, 2011.
U.S. Appl. No. 13/314,444, filed Dec. 8, 2011.
U.S. Appl. No. 13/397,673, filed Feb. 15, 2012.
U.S. Appl. No. 13/571,797, filed Aug. 10, 2012.
U.S. Appl. No. 13/678,539, filed Nov. 15, 2012.
U.S. Appl. No. 13/678,544, filed Nov. 15, 2012.
U.S. Appl. No. 13/678,541, filed Nov. 15, 2012.
U.S. Appl. No. 13/678,543, filed Nov. 15, 2012.
Ahn, S.J. et al., "Highly Reliable 50nm Contact Cell Technology for 256Mb PRAM," IEEE VLSI Tech Symp., Jun. 2005, pp. 98-99.
Alavi, Mohsen, et al., "A PROM Element Based on Salicide Allgomeration of Poly Fuses in a CMOS Logic Process," IEEE IEDM, 97, pp. 855-858.
Andre, T. W. et al., "A 4-Mb 0.18um 1T1MTJ Toggle MRAM With Balanced Three Input Sensing Scheme and Locally Mirrored Unidirectional Write Drivers," IEEE J. of Solid-State Circuits, vol. 40, No. 1, Jan. 2005, pp. 301-309.
Ang, Boon et al., "NiSi Polysilicon Fuse Reliability in 65nm Logic CMOS Technology," IEEE Trans. on Dev. Mat. Rel. vol. 7, No. 2, Jun. 2007, pp. 298-303.
Aziz, A. et al., "Lateral Polysilicon n+p Diodes: Effect of the Grain boundaries and of the p-Implemented Doping Level on the I-V and C-V Characteristics, "Springer Proceedings in Physics, vol. 54, 1991, pp. 318-322.
Aziz, A. et al., "Lateral Polysilicon PN Diodes: Current-Voltage Characteristics Simulation Between 200K and 400K a Numerical Approach," IEEE Trans. on Elec. Dev., vol. 41, No. 2, Feb. 1994, pp. 204-211.
Banerjee, Kaustav et al., "High Current Effects in Salicide Films for Sub-0.25um VLSI Technologies," IEEE 36th IRPS, 1998, pp. 284-292.
Bedeschi, F. et al., "4-Mb MOSFET-Selected uTrench Phase-Change Memory Experimental Chip," IEEE J. of Solid-State Circuits, vol. 40, No. 7, Jul. 2005, pp. 1557-1565.
Bedeschi, F. et al., "A Bipolar-Selected Phase Change Memory Featuring Multi-Level Cell Storage," IEEE J. Sol. Stat. Cir., vol. 44, No. 1, Jan. 2009, pp. 217-227.
Bedeschi, F. et al., "A Fully Symmetrical Sense Amplifier for Non-volatile Memories," IEEE. Int. Symp. on Circuits and Systems, (ISCAS), vol. 2, 2004, pp. 625-628.
Bedeschi, F. et al., "An 8Mb Demonstrator for High-Density 1.8V Phase-Change Memories," VLIS Cir. Symp., Jun. 2004, pp. 442-445.
Bedeschi, F. et al., "Set and Reset Pulse Characterization in BJT-Selected Phase-Change Memory," IEEE Int. Symp. on Circuits and Systems (ISCAS), 2005, pp. 1270-1273.
Braganca, P. M. et al., "A Three-Terminal Approach to Developing Spin-Torque Written Magnetic Random Access Memory Cells," IEEE Trans. on Nano. vol. 8, No. 2, Mar. 2009, pp. 190-195.
Cagli, C. et al., "Evidence for threshold switching in the set process of NiO-based RRAM and physical modeling for set, reset, retention and disturb prediction," IEEE IEDM, 2008, pp. 1-4.
Chan, W. T. et al., "CMOS Compatible Zero-Mask One-Time Programmable (OTP) Memory Design," Proc. Int. Conf. Solid State Integr. Cir. Tech., Beijing, China, Oct. 20-23, 2008. pp. 861-864.
Chan, Wan Tim, et al., "CMOS Compatible Zero-Mask One Time Programmable Memory Design", Master Thesis, Hong-Kong University of Science and Technologies, 2008.
Chang, Meng-Fan et al., "Circuit Design Challenges in Embedded Memory and Resistive RAM (RRAM) for Mobile SoC and 3D-IC", Design Automation Conference (ASP-DAC), 16th Asia and South Pacific, 2011, pp. 197-203.

(56) References Cited

OTHER PUBLICATIONS

Cheng, Yu-Hsing et al., "Failure Analysis and Optimization of Metal Fuses for Post Package Trimming," IEEE 45th IRPS, 2007, pp. 616-617.
Chiu, Pi-Feng et al., "A Low Store Energy, Low VDDmin, Nonvolatile 8T2R SRAM with 3D Stacked RRAM Devices for Low Power Mobile Applications," IEEE VLSI Cir./Tech Symp., Jun. 2010, pp. 229-230.
Cho, Woo Yeong et al., "A 0.18um 3.0V 64Mb Non-Volatile Phase-Transition Random-Access Memory (PRAM)," ISSCC, Feb. 2004, Sec. 2-1.
Choi, Sang-Jun et al., "Improvement of CBRAM Resistance Window by Scaling Down Electrode Size in Pure-GeTe Film," IEEE Elec. Dev., vol. 30, No. 2, Feb. 2009, pp. 120-122.
Choi, Youngdon et al., "A 20nm 1.8V 8Gb PRAM with 40MB/s Program Bandwidth," IEEE ISSCC, 2012, pp. 46-47.
Chung, S. et al., "A 1.25um2 Cell 32Kb Electrical Fuse Memory in 32nm CMOS with 700mV Vddmin and Parallel/Serial Interface," VLSI Cir. Symp., Jun. 2009, pp. 30-31.
Chung, S. et al., "A 512x8 Electrical Fuse Memory with 15um2 Cells Using 8-sq Asymmetrical Fuse and Core Devices in 90nm CMOS," VLSI Cir. Symp., Jun. 2007, pp. 74-75.
Crowley, Matthew et al., "512Mb PROM with 8 Layers of Antifuse/Diode Cells," IEEE ISSCC 2003, Sec. 16.4.
De Sandre, Guido et al., "A 4Mb LV MOS-Selected Embedded Phase Change Memory in 90nm Standard CMOS Technology," IEEE J. Sol. Stat. Cir, vol. 46. No. 1, Jan. 2011, pp. 52-63.
De Sandre, Guido et al., "A 90nm 4Mb Embedded Phase-Change Memory with 1.2V 12ns Read Access Time and 1MB/s Write Throughput," ISSCC 2010, Sec. 14.7.
Desikan, Rajagopalan et al., "On-Chip MRAM as a High-Bandwidth Low-Latency Replacement for DRAM Physical Memories," Tech Report TR-02-47, Dept. of Computer Science, University of Texas, Austin, Sep. 27, 2002, 18 pages.
Dietrich, Stefan et al., "A Nonvolatile 2-Mbit CBRAM Memory Core Featuring Advanced Read and Program Control," IEEE J. of Solid-Stat Cir., vol. 42, No. 4, Apr. 2007, pp. 839-845.
Dion, Michael J., "Reservoir Modeling for Electromigration Improvement of Metal Systems with Refractory Barriers," IEEE 39th IRPS, 2001, pp. 327-333.
Doorn, T. S. et al., "Ultra-fast Programming of Silicided Polysilicon Fuses Based on New Insights in the Programming Physics," IEEE IEDM, 2005, pp. 667-670.
Doorn, T. S., "Detailed Qualitative Model for the Programming Physics of Silicided Polysilicon Fuses," IEEE Trans. on Elec. Dev. vol. 54, No. 12, Dec. 2007, pp. 3285-3291.
Durlam, M. et al., "A 1-Mbit MRAM Based on 1T1MTJ Bit Cell Integrated With Copper Interconnects," IEEE J. of Solid-State Circuits, vol. 38, No. 5, May 2003, pp. 769-773.
Engel, B. et al., "The Science and Technology of Magnetoresistive Tunnel Memory," IEEE Tran. on Nanotechnology, vol. 1, No. 1, Mar. 2002, pp. 32-38.
Engel, B.N. et al., "A 4Mb Toggle MRAM Based on a Novel bit and Switching Method," IEEE Trans. on Mag. vol. 41, No. 1, Jan. 2005, pp. 132-136.
Fellner, Johannes, et al., "Lifetime Study for a Poly Fuse in a 0.35um Polycide CMOS Process," IEEE 43rd IRPS, 2005, pp. 446-449.
Gao, B. et al., "Oxide-Based RRAM: Uniformity Improvement Using a New Material-Oriented Methodology," IEEE VLSI Tech. Symp., Jun. 2009, pp. 30-31.
Gao, B. et al., "Oxide-Based RRAM Switching Mechanism: A New Ion-Transport-Recombination Model," IEDM, Dec. 2008, pp. 563-566.
Gill, M. et al., "Ovonic Unified Memory-A High Performance Nonvolatile Memory Technology for Stand-Alone Memory and Embedded Applications," IEEE, ISSCC Dig. of Tech. Paper, Feb. 2002, pp. 202-203.
Gogl, D. et al., "A 16-Mb MRAM Featuring Bootstrapped Write Drivers," IEEE J. of Solid-State Circuits, vol. 40, No. 4, Apr. 2005, pp. 902-908.

Gopalan, C. et al., Demonstration of Conductive Bridging Random Access Memory (CBRAM) in Logic CMOS Process, IEEE Int. Memory Workshop, 2010, pp. 1-4.
Ha, Daewon and Kim, Kinam, "Recent Advances in High Density Phase Change Memory (PRAM)," IEEE VLSI Tech. Symp. Jun. 2007.
Hosoi, Y. et al., "High Speed Unipolar Switching Resistance RAM (RRAM) Technology," IEEE IEDM, Dec. 2006, pp. 1-4.
Hosomi, M. et al., "A Novel Nonvolatile Memory with Spin Torque Transfer Magnetization Switching: Spin-RAM," IEEE IEDM Dig. of Tech. Paper, Dec. 2005, pp. 459-463.
Huang, Chia-En et al., "A New CMOS Logic Anti-Fuse Cell with Programmable Contact," IEEE IEDM Tech. Dig. 2007, pp. 48-51.
Im, Jay et al., "Characterization of Silicided Polysilicon Fuse Implemented in 65nm CMOS Technology,"7th Annual Non-Volatile Memory Technology Symp, (NVMTS) 2006, pp. 55-57.
Jin, Li-Yan et al., "Low-Area 1-Kb Multi-Bit OTP IP Design," IEEE 8th Int. Conf. on ASIC (ASICON), 2009. pp. 629-632.
Johnson, Mark et al., "512Mb PROM with a Three-Dimensional Array of Diode/Antifuse Memory Cells," IEEE J. of Sol. Stat. Cir., vol. 38, No. 11, Nov. 2003, pp. 1920-1928.
Kalnitsy, Alexander et al., "CoSi2 Integrated Fuses on Poly Silicon for Low Voltage 0.18um CMOS Applications," IEEE IEDM 1999, pp. 765-768.
Kang, Han-Byul et al., "Electromigration of NiSi Poly Gated Electrical Fuse and Its Resistance Behaviors Induced by High Temperature," IEEE IRPS, 2010, pp. 265-270.
Kang, Sangbeom et al., "A 0.1um 1.8V 256Mb Phase-Change Random Access Memory (PRAM) with 66Mhz Synchronous Burst-Read," IEEE J. of Sol. Stat. Cir. vol. 42. No. 1, Jan. 2007, pp. 210-218.
Kawahara, T. et al., "2Mb Spin-Transfer Torque RAM (SPRAM) with Bit-by-Bit Bidirectional Current Write and Parallelizing-Direction Current Read," IEEE ISSCC Dig. of Tech. Paper, Feb. 2007, pp. 480-481.
Ker, Ming-Dou et al., "High-Current Characterization of Polysilicon Diode for Electrostatic Discharge Protection in Sub-Quarter-Micron Complementary Metal Oxide Semiconductor Technology," Jpn. J. Appl. Phys. vol. 42 (2003) pp. 3377-3378.
Ker, Ming-Dou et al., "Ultra-High-Voltage Charge Pump Circuit in Low-Voltage Bulk CMOS Processes With Polysilicon Diodes," IEEE Trans. on Cir. and Sys.-II: Exp. Brief., vol. 54, No. 1, Jan. 2007, pp. 47-51.
Kim, Deok-Kee et al., "An Investigation of Electrical Current Induced Phase Transitions in the NiPtSi/Polysilicon System," J. App. Phy. 103, 073708 (2008).
Kim, I. S. et al., "High Performance PRAM Cell Scalable to sub-20nm Technology with below 4F2 Cell Size, Extendable to DRAM Applications," IEEE VLSI Tech Symp., Jun. 2010, pp. 203-204.
Kim, Jinbong et al., "3-Transistor Antifuse OTP ROM Array Using Standard CMOS Process," IEEE VLSI Cir. Symposium, Jun. 2003, pp. 239-242.
Kim, O. et al., "CMOS trimming circuit based on polysilicon fusing," Elec. Lett. vol. 34, No. 4, pp. 355-356, Feb. 1998.
Klee, V. et al., "A 0.13um Logic-Based Embedded DRAM Technology with Electrical Fuses, Cu Interconnect in SiLK, sub-7ns Random Access Time and its Extension to the 0.10um Generation," IEEE IEDM, 2001, pp. 407-410.
Kothandaramam, C. et al., "Electrically programmable fuse (eFUSE) using electromigration in silicides," IEEE Elec. Dev. Lett., vol. 23, No. 9, pp. 523-525, Sep. 2002.
Kulkarni, S. et al., "High-Density 3-D Metal-Fuse PROM Featuring 1.37um2 1T1R Bit Cell in 32nm High-K Metal-Gate CMOS Technology," VLSI Cir. Symp., Jun. 2009 pp. 28-29.
Kulkarni, S. et al., "A 4Kb Metal-Fuse OTP-ROM Macro Featuring a 2V Programmable 1.37um2 1T1R Bit Cell in 32nm High-K Metal-Gate CMOS," IEEE J. of Sol. Stat. Cir, vol. 45, No. 4, Apr. 2010, pp. 863-868.
Kund, Michael et al., "Conductive Bridging RAM (CBRAM): An Emerging Non-Volatile Memory Technology Scalable to Sub 20nm," IEEE IEDM 2005, pp. 754-757.
Lai, Han-Chao et al., "A 0.26um2 U-Shaped Nitride-Based Programming Cell on Pure 90nm CMOS Technology," IEEE Elec. Dev. Lett. vol. 28, No. 9, Sep. 2007, pp. 837-839.

(56) References Cited

OTHER PUBLICATIONS

Lai, S., "Current Status of the Phase Change Memory and Its Future," IEEE IEDM Dig. of Tech. Paper, Dec. 2003, pp. 255-258.
Lee, H.Y. et al., "Low Power and High Speed Bipolar Switching with a Thin Reactive Ti Buffer Layer in Robust HfO2 Based RRAM," IEEE IEDM, 2008, pp. 1-4.
Lee, K.J., et al., "A 90nm 1.8V 512Mb Diode-Switch PRAM with 266MB/s Read Throughout," IEEE ISSCC, Dig. of Tech. Paper, Feb. 2007, 3 pgs.
Lee, Kwang-Jin et al., "A 90nm 1.8V 512Mb Diode-Switch PRAM with 266MB/s Read Throughput," IEEE J. of Sol. Stat. Cir., vol. 43, No. 1, Jan. 2008, pp. 150-162.
Lee, M.-J. et al., "Stack Friendly all-Oxide 3D RRAM Using GaInZnO Peripheral TFT Realized Over Glass Substrates," IEDM, Dec. 2008. pp. 1-4.
Lee, Man Chiu et al., "OTP Memory for Low Cost Passive RFID Tags," IEEE Conf. on Electron Devices and Solid-State Circuits (EDSSC), 2007, pp. 633-636.
Liaw, Corvin et al., "The Conductive Bridging Random Access Memory (CBRAM): A Non-volatile Multi-Level Memory Technology," 37th European Solid-State Device Research Conference (ESSDERC), 2007, pp. 226-229.
Lim, Kyunam et al., "Bit Line Coupling Scheme and Electrical Fuse Circuit for Reliable Operation of High Density DRAM," IEEE VLSI Cir. Symp. Jun. 2001, pp. 33-34.
Maffitt, T. et al., "Design Considerations for MRAM," IBM J. Res. & Dev., vol. 50, No. 1, Jan. 2006, pp. 25-39.
Meng, X.Z. et al., "Reliability Concept for Electrical Fuses," IEE Proc.-Sci Meas. Technol., vol. 144, No. 2, Mar. 1997, pp. 87-92.
Min, Byung-Jun et al., "An Embedded Non-volatile FRAM with Electrical Fuse Repair Scheme and One Time Programming Scheme for High Performance Smart Cards," IEEE CICC, Nov. 2005, pp. 255-258.
Mojumder, N. N. et al., "Three-Terminal Dual-Pillar STT-MRAM for High Performance Robust Memory Applications," IEEE Trans. Elec. Dev. vol. 58. No. 5, May 2011, pp. 1508-1516.
Morimoto, T. et al., "A NiSi Salicide Technology for Advanced Logic Devices," IEEE IEDM, Dec. 1991, pp. 653-656.
Neale, Ron, "PCM Progress Report No. 6 Afterthoughts," http://www.eetimes.com/General/PrintView/4236240, Feb. 13, 2012, 5 pages.
Nebashi, R. et al., "A 90nm 12ns 32Mb 2T1MTJ MRAM," IEEE ISSCC Dig. of Tech. Paper, Sess. 27.4, Feb. 2009, 3 pages.
Ng, K.P. et al., "Diode-Base Gate Oxide Anti-Fuse One-Time Programmable Memory Array in Standard CMOS Process," IEEE Int. Conf. of Elect. Dev. & Solid-Stat Cir. (EDSSC), Dec. 2009, pp. 457-460.
Ohbayashi, Shigeki et al., "A 65nm Embedded SRAM With Wafer Level Burn-In Mode, Leak-Bit Redundancy and Cu E-Trim Fuse for Known Good Die," IEEE J. of Solid. Stat. Cir., vol. 43, No. 1, Jan. 2008, pp. 96-108.
Oh, G. H. et al., "Parallel Multi-Confined (PMC) Cell Technology for High Density MLC PRAM," IEEE VLSI Tech. Symp., Jun. 2009, pp. 220-221.
Oh, J. H. et al., "Full Integration of Highly Manufacturable 512Mb PRAM Based on 90nm Technology," IEEE IEDM Dig. of Tech. Paper, Dec. 2006, pp. 1-4.
Osada, K. et al., "Phase Change RAM Operated with 1.5V CMOS as Low Cost Embedded Memory," IEEE CICC, Nov. 2005, pp. 431-434.
Park, Don et al., "Study on Reliability of Metal Fuse for Sub-100nm Technology," IEEE Int. Symp. on Semiconductor Manufacturing (ISSM), 2005, pp. 420-421.
Park, Jongwoo et al., "Phase Transformation of Programmed NiSi Electrical Fuse: Diffusion, Agglomeration, and Thermal Stability," 18th IEEE Int. Symp. on Physical and Failure Analysis of Integrated Circuits, (IPFA), 2011, pp. 1-7.
Park, Young-Bae et al., "Design of an eFuse OTP Memory of 8 Bits Based on a 0.35um BCD Process," Mobile IT Convergence (ICMIC), 2011 Int. Conf. on, pp. 137-139.

Pellizzer, F. et al., "Novel uTrench Phase-Change Memory Cell for Embedded and Stand-alone Non-Volatile Memory Applications," IEEE VLSI Tech Symp. Jun. 2004, pp. 18-19.
Peng, J. et al., "A Novel Embedded OTP NVM Using Standard Foundry CMOS Logic Technology," IEEE 21st Non-Volatile Semiconductor Memory Workshop (NVSMW) 2006, pp. 24-26.
Rizzolo, R. F. et al., "IBM System z9 eFUSE applications and methodology," IBM J. Res. & Dev. vol. 51 No. 1/2 Jan.-Mar. 2007, pp. 65-75.
Robson, Norm et al., "Electrically Programmable Fuse (eFUSE) from Memory Redundancy to Autonomic Chips," IEEE CICC, 2007, pp. 799-804.
Russo, U. et al., "Conductive-Filament Switching Analysis and Self-Accelerated Thermal Dissolution Model for Reset in NiO-based RRAM," IEDM, Dec. 2007, pp. 775-778.
Safran, J. et al., "A Compact eFUSE Programmable Array Memory for SOI CMOS," VLSI Cir. Symp. Jun. 2007, pp. 72-73.
Sasaki, Takahiko et al., "Metal-Segregate-Quench Programming of Electrical Fuse," IEEE 43rd IRPS, 2005, pp. 347-351.
Schrogmeier, P. et al., "Time Discrete Voltage Sensing and Iterative Programming Control for a 4F2 Multilevel CBRAM," VLSI Cir. Symp., Jun. 2007, pp. 186-187.
Sheu, Shyh-Shyuan et al., "A 5ns Fast Write Multi-Level Non-Volatile 1K-bits RRAM Memory with Advance Write Scheme," VLSI Cir. Symp., Jun. 2009, pp. 82-83.
Sheu, Shyh-Shyuan et al., "Fast-Write Resistive RAM (RRAM) for Embedded Applications," IEEE Design & Test of Computers, Jan.-Feb. 2011, pp. 64-71.
Shi, Min et al., "Zero-Mask Contact Fuse for One-Time-Programmable Memory in Standard CMOS Processes," IEEE Dev. Lett. vol. 32, No. 7, Jul. 2011, pp. 955-957.
Song, Y. J. et al., "Highly Reliable 256Mb PRAM with Advanced Ring Contact Technology and Novel Encapsulating Technology," IEEE VLSI Tech Symp., Jun. 2006, pp. 153-154.
Suto, Hiroyuki et al., "Programming Conditions for Silicided Poly-Si or Copper Electrically Programmable Fuses," IEEE IIRW Final Report, 2007, pp. 84-89.
Suto, Hiroyuki et al., "Study of Electrically Programmable Fuses Through Series of I-V Measurements," IEEE IIRW Final Report, 2006, pp. 83-86.
Suto, Hiroyuki et al., "Systematic Study of the Dopant-Dependent Properties of Electrically Programmable Fuses With Silicide Poly-Si Links Through a Series of I-V Measurements," IEEE Trans. on Dev. Mat. Rel. vol. 7, No. 2, Jun. 2007, pp. 285-297.
Takaoka, H. et al., A Novel Via-fuse Technology Featuring Highly Stable Blow Operation with Large On-off Ratio for 32nm Node and Beyond, IEDM, 2007, pp. 43-46.
Tehrani, S. et al., "Magnetoresistive Random Access Memory Using Magnetic Tunnel Junction," Proc. of IEEE, vol. 91, No. 5, May 2003, pp. 703-714.
Tehrani, S., "Status and Outlook of MRAM Memory Technology," IEEE IEDM Dig. of Tech Paper., Dec. 2006, pp. 1-4.
Teichmann, J. et al., "One Time Programming (OTP) with Zener Diodes in CMOS Processes," 33rd Conf. on European Solid-State Device Research (ESSDERC), 2003, pp. 433-436.
Tian, C. et al., "Reliability Investigation of NiPtSi Electrical Fuse with Different Programming Mechanisms," IEEE IIRW Final Report, 2007, pp. 90-93.
Tian, C. et al., "Reliability Qualification of CoSi2 Electrical Fuse for 90nm Technology," IEEE 44th IRPS, 2006, pp. 392-397.
Tian, Chunyan et al., "Reliability Investigation of NiPtSi Electrical Fuse with Different Programming Mechanisms," IEEE Trans. on Dev. Mat. Rel. vol. 8, No. 3, Sep. 2008, pp. 536-542.
Tonti, W. R. et al., "Product Specific Sub-Micron E-Fuse Reliability and Design Qualification," IEEE IIRW Final Report, 2003, pp. 36-40.
Tonti, W. R., "Reliability and Design Qualification of a Sub-Micro Tungsten Silicide E-Fuse," IEEE IRPS Proceedings, 2004, pp. 152-156.
Tonti, W. R., "Reliability, Design Qualification, and Prognostic Opportunity of in Die E-Fuse," IEEE Conference on Prognostics and Health Management (PHM), 2011, pp. 1-7.

(56) References Cited

OTHER PUBLICATIONS

Ueda, T. et al., "A Novel Cu Electrical Fuse Structure and Blowing Scheme utilizing Crack-assisted Mode for 90-45nm-node and beyond," IEEE VLSI Tech. Sym., Jun. 2006, 2 pages.
Ulman, G. et al., "A Commercial Field-Programmable Dense eFUSE Array Memory with 00.999% Sense Yield for 45nm SOI CMOS", ISSCC 2008/ Session 22 /Variation Compensation and Measurement/ 22.4, 2008 IEEE International Solid-State Circuits Conference, pp. 406-407.
Vimercati, Daniele et al., "A 45nm 1Gbit 1.8V PCM for Wireless and Embedded Applications," IEEE ISSCC Feb. 2010, 26 pages.
Vinson, J. E., "NiCr Fuse Reliability—A New Approach," Southcon/94, Conference Record, 1994, pp. 250-255.
Walko, J., "Ovshinsky's Memories," IEE Review, Issue 11, Nov. 2005, pp. 42-45.
Wang, J. P. et al., "The Understanding of Resistive Switching Mechansim in HfO2-Based Resistive Random Access Memory," IEDM, 2011, pp. 12.1.1-12.1.4.
Wikipedia, "Programmable read-only memory", http://en.wikipedia.org/wiki/Programmable_read-only_memory, downloaded Jan. 31, 2010, 4 pages.
Worledge, D.C., "Single-Domain Model for Toggle MRAM," IBM J. Res. & Dev. vol. 50, No. 1, Jan. 2006, pp. 69-79.
Wu, Kuei-Sheng et al., "The Improvement of Electrical Programmable Fuse with Salicide-Block Dielectrical Film in 40nm CMOS Technology," Interconnect Technology Conference (IITC), 2010 Int. pp. 1-3.
Wu, Kuei-Sheng et al., "Investigation of Electrical Programmable Metal Fuse in 28nm and beyond CMOS Technology," IEEE International Interconnect Technology Conference and 2011 Materials for Advanced Metallization (IITC/MAM), 2011, pp. 1-3.
Yin, M. et al., "Enhancement of Endurance for CuxO based RRAM Cell," 9th Int. Conf. on Solid-State and Integrated-Circuit Technology (ICSICT) 2008, pp. 917-920.
Zhu, Jian-Gang, "Magnetoresistive Random Access Memory: The Path to Competitiveness and Scalability," Proc. of IEEE, vol. 96, No. 11, Nov. 2008, pp. 1786-1798.
Zhuang, W. W. et al., "Novell Colossal Magnetonresistive Thin Film Nonvolatile Resistance Random Access Memory (RRAM)," IEEE IEDM 2002, pp. 193-196.
Notice of Allowance for U.S. Appl. No. 13/026,664 mailed Sep. 18, 2012.
Office Action for U.S. Appl. No. 13/471,704 mailed Jul. 31, 2012.
Notice of Allowance for U.S. Appl. No. 13/471,704 mailed Oct. 18, 2012.
Notice of Allowance for U.S. Appl. No. 13/026,678 mailed Sep. 19, 2012.
Office Action for U.S. Appl. No. 13/026,783 mailed Sep. 27, 2012.
Office Action for U.S. Appl. No. 13/026,717 mailed Oct. 25, 2012.
Office Action for U.S. Appl. No. 13/026,650 mailed Nov. 9, 2012.
Office Action for U.S. Appl. No. 13/026,692 mailed Nov. 9, 2012.
Office Action for U.S. Appl. No. 13/026,752 mailed Nov. 9, 2012.
Office Action for U.S. Appl. No. 13/026,656 mailed Nov. 13, 2012.
Office Action for U.S. Appl. No. 13/026,704 mailed Nov. 23, 2012.
Office Action for U.S. Appl. No. 13/397,673, mailed Dec. 18, 2012.
Office Action for U.S. Appl. No. 13/026,840, mailed Dec. 31, 2012.
Office Action for U.S. Appl. No. 13/026,852, mailed Jan. 14, 2013.
Office Action for U.S. Appl. No. 13/026,783, mailed Sep. 27, 2012.
Restriction Requirement for U.S. Appl. No. 13/026,835, mailed Dec. 12, 2012.
Notice of Allowance for U.S. Appl. No. 13/026,717, mailed Feb. 12, 2013.
Office Action for U.S. Appl. No. 13/471,704, mailed Jan. 25, 2013.
U.S. Appl. No. 13/761,048, filed Feb. 6, 2013.
U.S. Appl. No. 13/761,057, filed Feb. 6, 2013.
U.S. Appl. No. 13/761,097, filed Feb. 6, 2013.
U.S. Appl. No. 13/761,045, filed Feb. 6, 2013.
Office Action for U.S. Appl. No. 13/026,678, mailed Feb. 20, 2013.
Notice of Allowance for U.S. Appl. No. 13/026,783, mailed Mar. 4, 2013.
Notice of Allowance for U.S. Appl. No. 13/026,692, mailed Mar. 15, 2013.
Office Action for U.S. Appl. No. 13/026,704, mailed Nov. 23, 2012.
Notice of Allowance for U.S. Appl. No. 13/026,835, mailed Mar. 20, 2013.
Notice of Allowance for U.S. Appl. No. 13/026,664, mailed Apr. 22, 2013.
Notice of Allowance for U.S. Appl. No. 13/026,656, mailed Apr. 22, 2013.
Jagasivamani et al., "Development of a Low-Power SRAM Compiler", IEEE Press, 2001, pp. 498-501.
Liu et al., "A Flexible Embedded SRAM Compiler", IEEE Press, 2002, 3 pgs.
Sundrararajan, "OSUSPRAM: Design of a Single Port SRAM Compiler in NCSU FREEPDK45 Process", Mater of Science in Electrical Engineering, Oklahoma State University, Jul. 2010, 117 pgs.
Notice of Allowance for U.S. Appl. No. 13/026,835, Mailed Apr. 18, 2013.
Notice of Allowance for U.S. Appl. No. 13/026,704, mailed Apr. 30, 2013.
Notice of Allowance for U.S. Appl. No. 13/026,852, mailed May 10, 2013.
Notice of Allowance for U.S. Appl. No. 13/026,717, mailed May 15, 2013.
Notice of Allowance for U.S. Appl. No. 13/471,704, mailed May 22, 2013.
Notice of Allowance for U.S. Appl. No. 13/026,678, mailed May 28, 2013.
Notice of Allowance for U.S. Appl. No. 13/026,650, mailed May 30, 2013.
Restriction Requirement for U.S. Appl. No. 13/314,444, mailed Jun. 7, 2013.
Restriction Requirement for U.S. Appl. No. 13/214,198, mailed Jun. 13, 2013.
Notice of Allowance for U.S. Appl. No. 13/026,840, mailed Jun. 13, 2013.
Restriction Requirement for U.S. Appl. No. 13/026,771, mailed Jun. 13, 2013.
Notice of Allowance for U.S. Appl. No. 13/026,752, mailed Jul. 1, 2013.
Restriction Requirement for U.S. Appl. No. 13/678,543, mailed Jul. 8, 2013.
Office Action for U.S. Appl. No. 13/026,725, mailed Jul. 19, 2013.
Notice of Allowance for U.S. Appl. No. 13/026,664, mailed Jul. 22, 2013.
Notice of Allowance for U.S. Appl. No. 13/026,692, mailed Jul. 23, 2013.
Notice of Allowance for U.S. Appl. No. 13/397,673, mailed Jul. 30, 2013.
Notice of Allowance for U.S. Appl. No. 13/026,704, mailed Aug. 2, 2013.
Notice of Allowance for U.S. Appl. No. 13/026,783, mailed Aug. 5, 2013.
Office Action for U.S. Appl. No. 13/214,198, mailed Aug. 6, 2013.
Office action for Chinese Patent Application No. 201110279954.7, mailed Jul. 1, 2013.
Shen et al., "High-K Metal Gate Contact RRAM (CRRAM) in Pure 28 nm CMOS Logic Process", Electron Devices Meeting (IEDM), 2012 IEEE International, Dec. 2012, 4 pgs.
Tseng et al., "A New High-Density and Ultrasmall-Cell Size Contact RRAM (CR-RAM) with Fully CMOS-Logic-Compatible Technology and Circuits", IEEE Transactions on Electron Devices, vol. 58, Issue 1, Jan. 2011, 6 pgs.
Office Action for U.S. Appl. No. 13/026,783, mailed Sep. 9, 2013.
Office Action for U.S. Appl. No. 13/314,444, mailed Sep. 9, 2013.
Office Action for U.S. Appl. No. 13/026,771, mailed Sep. 9, 2013.
Notice of Allowance for U.S. Appl. No. 13/026,852, mailed Sep. 18, 2013.
Office Action (Ex Parte) for U.S. Appl. No. 13/678,543, mailed Sep. 20, 2013.
Office Action for U.S. Appl. No. 13/835,308, mailed Sep. 27, 2013.
Notice of Allowance for U.S. Appl. No. 13/026,717, mailed Oct. 1, 2013.

(56) References Cited

OTHER PUBLICATIONS

Office Action for U.S. Appl. No. 13/954,831, mailed Oct. 1, 2013.
Notice of Allowance for U.S. Appl. No. 13/026,656, mailed Oct. 4, 2013.
Office Action for U.S. Appl. No. 13/214,183, mailed Oct. 25, 2013.
Chua, "Many Times Programmable z8 Microcontroller", e-Gizmo. cim, Nov. 21, 2006, pp. 1-5.
Forum, Intel Multi-byte Nops, asmcommunity.net, Nov. 21, 2006, pp. 1-5.
CMOS Z8 OTP Microcontrollers Product Specification, Zilog Inc., May 2008, Revision 1, pp. 1-84.
OTP Programming Adapter Product User Guide, Zilog Inc., 2006, pp. 1-3.
Notice of Allowance for U.S. Appl. No. 13/026,852, mailed Nov. 15, 2013.
Notice of Allowance for U.S. Appl. No. 13/026,835, mailed Nov. 22, 2013.
Notice of Allowance for U.S. Appl. No. 13/026,725, mailed Dec. 10, 2013.
Office Action for U.S. Appl. No. 13/026,783, mailed Dec. 23, 2013.
Notice of Allowance for U.S. Appl. No. 13/026,771, mailed Jan. 15, 2014.
Office Action for Chinese Patent Application No. 201110244362.1, mailed Sep. 29, 2013.
Office Action for Chinese Patent Application No. 201110235464.7, mailed Oct. 8, 2013.
Office Action for Chinese Patent Application No. 201110244400.3, mailed Nov. 5, 2013.
Office Action for Chinese Patent Application No. 201110244342.4, mailed Oct. 31, 2013.
Restriction Requirement for U.S. Appl. No. 13/678,541, mailed Feb. 28, 2014.
Notice of Allowance for U.S. Appl. No. 13/026,840, mailed Mar. 6, 2014.
Notice of Allowance for U.S. Appl. No. 13/026,840, mailed Mar. 10, 2014.
Notice of Allowance of U.S. Appl. No. 13/678,543, mailed Dec. 13, 2013.
Notice of Allowance for U.S. Appl. No. 13/835,308, mailed Mar. 14, 2014.
Notice of Allowance for U.S. Appl. No. 13/026,835, mailed Mar. 14, 2014.
Notice of Allowance for U.S. Appl. No. 13/026,725, mailed Mar. 31, 2014.
Notice of Allowance for U.S. Appl. No. 13/026,852, mailed Mar. 20, 2014.
Notice of Allowance for U.S. Appl. No. 13/026,771, mailed Mar. 18, 2014.
Final Office Action for U.S. Appl. No. 13/214,183, mailed Apr. 17, 2014.
"Embedded Systems/Mixed C and Assembly Programming", Wikibooks, Aug 6, 2009, pp. 1-7.
Notice of Allowance for U.S. Appl. No. 13/761,097, mailed Jul. 15, 2014.
Office Action for U.S. Appl. No. 13/571,797, mailed Apr. 24, 2014.
Notice of Allowance for U.S. Appl. No. 13/590,044, mailed Apr. 29, 2014.
Notice of Allowance for U.S. Appl. No. 13/954,831, mailed May 27, 2014.
Notice of Allowance of U.S. Appl. No. 13/833,044, mailed May 29, 2014.
Notice of Allowance for U.S. Appl. No. 13/761,048, mailed Jun. 10, 2014.
Office Action for Taiwanese Patent Application No. 100129642, mailed May 19, 2014 (with translation).
Office Action for U.S. Appl. No. 13/072,783, mailed Nov. 7, 2013.
Notice of Allowance for U.S. Appl. No. 13/026,840, mailed Jun. 24, 2014.
Notice of Allowance for U.S. Appl. No. 13/214,198, mailed Jun. 23, 2014.
Notice of Allowance for U.S. Appl. No. 13/590,044, mailed Jun. 23, 2014.
Ker et al., "MOS-bounded diodes for on-chip ESD protection in a 0.15-μ m shallow-trench-isolation salicided CMOS Process" International Symposium on VLSI Technology, Systems and Applications, 2003, 5 pgs.
Notice of Allowance for U.S. Appl. No. 13/840,965, mailed Jun. 25, 2014.
Office Action for U.S. Appl. No. 13/970,562, mailed Jun. 27, 2014.
Office Action for U.S. Appl. No. 13/835,308, mailed Jun. 27, 2014.
Notice of Allowance for U.S. Appl. No. 13/288,843, mailed Jul. 8, 2014.
Restriction Requirement for U.S. Appl. No. 13/678,539, mailed Jul. 1, 2014.
Notice of Allowance for U.S. Appl. No. 14/231,413, mailed Jul. 18, 2014.
Notice of Allowance for U.S. Appl. No. 13/590,044, mailed Jul. 23, 2014.
Restriction Requirement for U.S. Appl. No. 13/833,067, mailed Jul. 11, 2014.
Notice of Allowance for U.S. Appl. No. 13/954,831, mailed Aug. 4, 2014.
Restriction Requirement for U.S. Appl. No. 13/678,544, mailed Aug. 1, 2014.
Notice of Allowance for U.S. Appl. No. 13/761,097, mailed Jul. 25, 2014.
Ex parte Quayle for U.S. Appl. No. 13/761,057, mailed Aug. 8, 2014.
Final Office Action for U.S. Appl. No. 13/314,444, mailed May 14, 2014.
Corrected Notice of Allowability for U.S. Appl. No. 13/288,843, mailed Aug. 19, 2014.
Office Action for U.S. Appl. No. 13/590,049, mailed Aug. 29, 2014.
Ex Parte Quayle for U.S. Appl. No. 13/590,047, mailed Aug. 29, 2014.
Ex Parte Quayle for U.S. Appl. No. 13/590,050, mailed Sep. 3, 2014.
Office Action for U.S. Appl. No. 13/678,544, mailed Sep. 12, 2014.
Office Action for U.S. Appl. No. 13/678,539, mailed Sep. 10, 2014.
Notice of Allowance for U.S. Appl. No. 13/288,843, mailed Sep. 18, 2014.
Notice of Allowance for U.S. Appl. No. 13/761,057, mailed Sep. 26, 2014.
Notice of Allowance for U.S. Appl. No. 13/833,044, mailed Sep. 24, 2014.
Notice of Allowance for U.S. Appl. No. 13/314,444, mailed Sep. 24, 2014.
Office Action for U.S. Appl. No. 13/761,045, mailed Sep. 30, 2014.
Notice of Allowance for U.S. Appl. No. 13/835,308, mailed Oct. 10, 2014.
Notice of Allowance for U.S. Appl. No. 13/571,797, mailed Oct. 14, 2014.
Office Action for U.S. Appl. No. 13/833,067, mailed Oct. 20, 2014.
Notice of Allowance for U.S. Appl. No. 14/085,228, mailed Oct. 23, 2014.
Office Action for U.S. Appl. No. 13/842,824, mailed Oct. 29, 2014.
Herner et al., "Vertical p-i-n Polysilicon Diode with Antifuse for stackable Field-Programmable ROM", IEEE Electron Device Letters, vol. 25, No. 5, pp. 271-273, May 2004.
Notice of Allowance for U.S. Appl. No. 13/590,049, mailed Nov. 25, 2014.
Notice of Allowance for U.S. Appl. No. 13/590,047, mailed Nov. 24, 2014.
Office Action for U.S. Appl. No. 13/590,044, mailed Dec. 9, 2014.
Notice of Allowance for U.S. Appl. No. 13/590,050, mailed Dec. 18, 2014.
Office Action for U.S. Appl. No. 14/042,392, mailed Dec. 31, 2014.
Office Action for U.S. Appl. No. 14/071,957, mailed Dec. 29, 2014.
International Search Report and Written Opinion for International Patent Application No. PCT/US/2014/056676, mailed Dec. 19, 2014.
Office Action for U.S. Appl. No. 14/493,083, mailed Jan. 8, 2015.
Office Action for Chinese Patent Application No. 2011102443903, mailed Dec. 16, 2014 (with translation).
Notice of Allowance for U.S. Appl. No. 13/970,562, mailed Jan. 23, 2015.

(56) References Cited

OTHER PUBLICATIONS

Notice of Allowance for U.S. Appl. No. 14/493,069, mailed Feb. 17, 2015.
Notice of Allowance for U.S. Appl. No. 14/085,228, mailed Feb. 18, 2015.
Notice of Allowance for U.S. Appl. No. 13/761,045, mailed Feb. 18, 2015.
Notice of Allowance for U.S. Appl. No. 14/231,404, mailed Jan. 22, 2015.
Office Action for U.S. Appl. No. 14/101,125, mailed Mar. 6, 2015.
Office Action for U.S. Appl. No. 13/026,783, mailed on Mar. 5, 2015.
Final Office Action for U.S. Appl. No. 13/678,539, mailed Apr. 1, 2015.
Office Action for U.S. Appl. No. 14/636,155, mailed on Apr. 10, 2015.
Notice of Allowance for U.S. Appl. No. 13,842,824, mailed Apr. 14, 2015.
Notice of Allowance for U.S. Appl. No. 14/071,957, mailed Apr. 14, 2014.
Notice of Allowance for U.S. Appl. No. 14/231,404, mailed Apr. 17, 2015.
Notice of Allowance for U.S. Appl. No. 13/590,444, mailed May 12, 2015.

* cited by examiner

OTP MEMORIES FUNCTIONING AS AN MTP MEMORY

CROSS-REFERENCE TO RELATED APPLICATIONS

This application claims priority benefit of U.S. Provisional Patent Application No. 61/699,255, filed on Sep. 10, 2012 and entitled "System and Method of Using OTP Memories to Function as An MTP Memory," which is hereby incorporated herein by reference.

BACKGROUND

One Time Programmable (OTP) memory can be fabricated in standard logic processes but can only be programmed once. Multiple-Time Programmable (MTP) memory can be programmed many times but fabrication requires special process steps and masks.

FIG. 1 shows a block diagram of a portion of a conventional OTP-for-MTP memory 10. An OTP-for-MTP memory is a physical OTP memory but appears to be capable of being programmed into the same address multiple times without the need to first erase data. The OTP-for-MTP memory 10 has 5 OTP banks, 12-0 through 12-4, with addresses and data coupled to external address and data bus DQ, respectively, through a multiplexer 13. The multiplexer 13 receives a bank select signal to route the external address/DQ to the address/DQ of each OTP bank 12-0 through 12-4, depending if the programming is the $1^{st}$, $2^{nd}$, $3^{rd}$, $4^{th}$ or $5^{th}$ time. In general, an n-time programmable MTP memory can be realized by using n arrays of the same size OTP memory for each time programming.

The techniques of using OTP to function as MTP as showed in FIG. 1 is relatively simple, but are not very efficient or cost effective. First, the size of the conventional MTP increases proportionately to the number of times it can be programmed. For example, for a 100-time MTP, a base OTP memory needs to be replicated 100 times to achieve the same functionality. Second, data utilization by the convention MTP is not very efficient. If the data in only one address of an OTP-for-MTP memory is programmed 100 times while the rest of the data stays the same, 99% of the programmability of the entire OTP memory capacity is wasted. Therefore, there is a need for improved techniques to achieve low cost, high data utilization, and efficient OTP-for-MTP memories.

SUMMARY

Techniques, systems and circuitry for using One-Time Programmable (OTP) memories to function as a Multiple-Time Programmable (MTP) memory are disclosed. The OTP-for-MTP memory can include at least one OTP data memory to store data, and at least one OTP CAM to store addresses and to search input address through valid entries of the OTP CAM to find a latest entry of the matched valid addresses. The OTP-for-MTP memory can also include a valid-bit memory to find a next available entry of the OTP data memory and OTP CAM. When programming data into the OTP-for-MTP memory, the address and data can be both programmed into the next available entry of the OTP CAM and the OTP data memory, respectively. When reading the OTP-for-MTP memory, the input address can be used to compare with valid entries of the addresses stored in the OTP CAM so that the latest entry of the matched valid addresses can be output. The latest entry can then be used to access the OTP data memory to retrieve data for output.

Embodiments disclosed herein use various schemes to make OTP memories to function as an MTP memory effectively. In one embodiment, the OTP-for-MTP memory can include at least one OTP address memory, at least one OTP data memory, and at least one OTP valid-bit memory. The three types of OTP memories can all have a plurality of entries and they are all associated with each other for each entry. When programming the OTP-for-MTP memory, the address and data can be both programmed into a new entry of OTP address memory and OTP data memory, respectively. The valid bit in the same entry of the OTP valid memory can also be programmed and a new entry can be updated. The new entry can be to be updated in a predetermined way, or simply in the increment/decrement order. Data at the same address can be programmed into the OTP-for-MTP repetitively in the new entries of the OTP address and data memory, until reaching the capacity limit of the OTP address and data memory. When reading data from the OTP-for-MTP, the input address can be searched through the entire valid OTP address memory. If there are any matches, the data in the OTP data memory associated with the latest entry of the valid matched address can be accessed for output; otherwise all bits with virgin state (normally "0") would be used for output. By using this approach, any data for any address can be programmed into the OTP-for-MTP many times without any restrictions or fixed compartments until the total capacity of the OTP address/data memory is reached.

The invention can be implemented in numerous ways, including as a method, system, device, or apparatus (including graphical user interface and computer readable medium). Several embodiments of the invention are discussed below.

As a memory, one embodiment can, for example, include at least one OTP address memory; at least one OTP data memory, at least one OTP valid-bit memory, a new entry generation block, at least one match block, and one multiple-match select block. Each type of the OTP memory has at least one entry and each entry can be associated with each other. When programming data into the OTP-for-MTP memory, the data and address can both be programmed into a new entry of OTP data and address memory, respectively. Valid bit in the new entry of the OTP valid memory can also be programmed, and a new entry is updated in the new entry generation block according to a predetermined order. When reading data from an address in the OTP-for-MTP, the address is searched through all valid entries of the OTP address memory by the match block. If there are any matches found, the latest entry of the valid matched address can be provided by the multiple-match select block based on new entry update order. The latest entry of the valid matched addresses can be used to access the OTP data memory for output. If no matches are found, a word with all virgin state (i.e. "0") can be used for output instead.

As a non-volatile memory, one embodiment can, for example, include at least: at least one One-Time Programmable (OTP) data memory that has a plurality of OTP memory cells to store data; and at least one OTP Content Addressable Memory (CAM) that has a plurality of OTP address memory cells to store valid addresses and a plurality of CAM memory cells to compare an input address with the valid addresses stored in the OTP address memory cells and to output a latest entry of the matched valid addresses. The non-volatile memory can be configured to be programmable multiple times on the same addresses by programming an address and data into a next available entry of the OTP CAM and the OTP data memory, respectively. The non-volatile memory can be configured to be read by using the input address to search the latest entry of the matched valid addresses in the OTP CAM and then use that address to access the OTP data memory to read data for output.

As an electronic system, one embodiment can, for example, include at least: a processor; and at least an OTP-for-MTP memory operatively connected to the processor. The OTP-for-MTP memory can include at least: an OTP address memory, an OTP data memory, an OTP valid-entry memory, a new entry generation, a match block, and a multiple-match select block. The OTP address memory, OTP data memory, and the OTP valid-entry memory all have at least one entry and each entry is associated with each other. When the processor programs the OTP-for-MTP, the address and data can both be programmed into a new entry of OTP address and OTP data memories, respectively. A valid bit can also be programmed in the new entry of the OTP valid memory. A new entry can be updated subsequently determined by the new entry generation block. The process of programming can continue until reaching the total capacity of the OTP address memory or OTP data memory. When the processor reads data from the OTP-for-MTP memory, the address is used to search through all valid entries of the OTP address memory by the match block. If there are any matches found, the latest entry of the valid matched addresses can be determined by the multiple-match select block according to the entry update order. Subsequently, the data in the latest entry of the valid matched address in the OTP data memory can be accessed as output. If no matches are found, a word with all virgin state (e.g. "0") will be sent as output.

As an electronic system, one embodiment can, for example, include at least: a processor and an MTP memory based on OTP memory operatively connected to the processor. The MTP memory can include: an OTP data memory having a plurality of entries of OTP memory cells to provide data storage; an OTP Content Addressable Memory (CAM) having a plurality of entries of OTP memory cells and CAM cells to provide address storage and to search an input address among valid addresses stored in the OTP memory cells and to output a latest entry of the matched valid address; and at least one register to provide a next available entry in the OTP data memory and OTP CAM. The MTP memory is configured to be programmable by programming an address and data into the next available entry in the OTP CAM and the OTP data memory, respectively. The MTP memory is configured to be read by searching an input address in the OTP CAM and providing the latest entry of the matched valid address to access the OTP data memory to read data for output.

As a method for making OTP memories to function as an MTP memory, one embodiment can, for example, include at least: providing at least one OTP address memory, at least one OTP data memory, at least one OTP valid-entry memory, a new entry generation method, a search method and a multiple-match resolution method. The OTP address memory, OTP data memory, and OTP valid entry memory have at least one entry. Each entry in the three types of OTP memories is associated with each other. The method to program an OTP-for-MTP memory can include (i) finding a new entry in the OTP address and data memories, (ii) programming the address and data into a new entry of the OTP address and OTP data memories, respectively; (iii) programming a valid bit associated with the new entry in the OTP valid memory; (iv) updating a new entry based on a pre-determined order. The method to read an OTP-for-MTP memory includes (i) searching the input address through the entire valid entries in the OTP address memory to find any entries of valid matched address, (iii) finding the latest entry if multiple matches occur, (ii) outputting data in the OTP data memory associated with the latest entry in the match addresses; and (iii) outputting data with all bits in virgin state, if no matches are found.

As a method of providing an MTP memory based on OTP memories, one embodiment can, for example, include at least: providing at least an OTP memory having a plurality of entries of OTP memory cells to store data; providing at least an OTP CAM having a plurality of entries of OTP memory cells to store valid addresses and a plurality of entries of CAM memory cells to compare an input address with valid addresses stored and outputting a latest entry of the matched valid addresses; finding the next available entry of the OTP data memory and OTP CAM; programming data and address into the next available entry of the OTP data and OTP CAM, respectively, when programming the MTP memory; and searching input address in all valid addresses stored in the OTP CAM to find the latest entry of the matched valid addresses to access the OTP data memory when reading the MTP memory.

BRIEF DESCRIPTION OF THE DRAWINGS

The present invention will be readily understood by the following detailed descriptions in conjunction with the accompanying drawings, wherein like reference numerals designate like structural elements, and in which.

DETAILED DESCRIPTION OF EMBODIMENTS OF THE INVENTION

Embodiments disclosed herein use various techniques to use OTP memories to emulate the functionality of an MTP memory. An OTP-for-MTP memory can appear to be programmable into the same addresses of an OTP memory multiple times (e.g., without being erased first).

Techniques, systems and circuitry for using One-Time Programmable (OTP) memories to function as a Multiple-Time Programmable (MTP) memory are disclosed. The OTP-for-MTP memory can include at least one OTP data memory to store data, and at least one OTP CAM to store addresses and to search input address through valid entries of the OTP CAM to find a latest entry of the matched valid addresses. The OTP-for-MTP memory can also include a valid-bit memory to find a next available entry of the OTP data memory and OTP CAM. When programming data into the OTP-for-MTP memory, the address and data can be both programmed into the next available entry of the OTP CAM and the OTP data memory, respectively. When reading the OTP-for-MTP memory, the input address can be used to compare with valid entries of the addresses stored in the OTP CAM so that the latest entry of the matched valid addresses can be output. The latest entry can then be used to access the OTP data memory to retrieve data for output.

In one embodiment, data and address can be recorded in OTP memories in a certain order whenever a programming occurs. During read, data associated with the latest address that has been programmed can be read from the OTP memory.

Several embodiments of the invention are discussed below with reference to FIGS. 2(a)-8. However, those skilled in the art will readily appreciate that the detailed description given herein with respect to these figures is for explanatory purposes as the invention extends beyond these limited embodiments.

Figure 1:
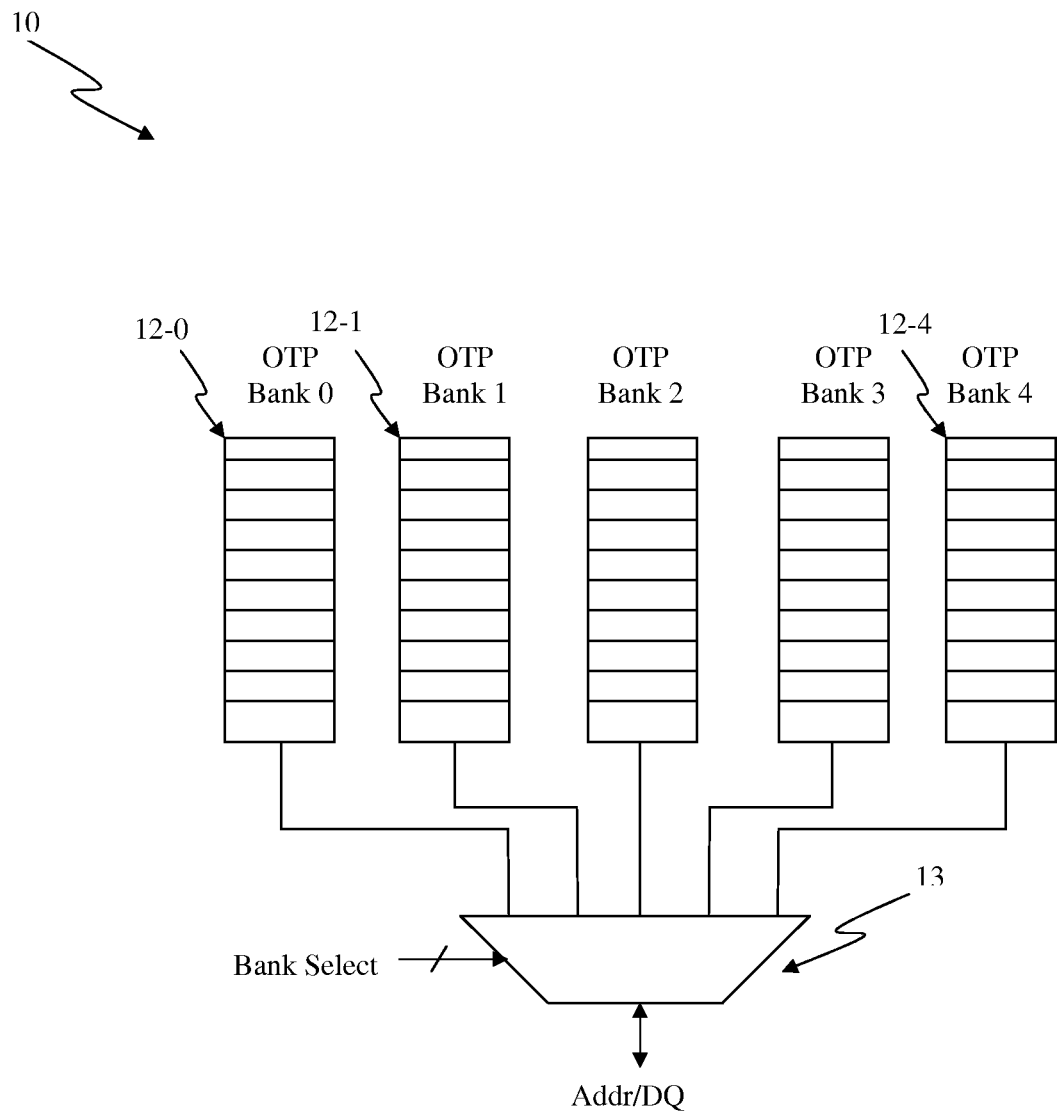
FIG. 1 shows a block diagram of a conventional OTP-for-MTP memory.
Figure 2A:
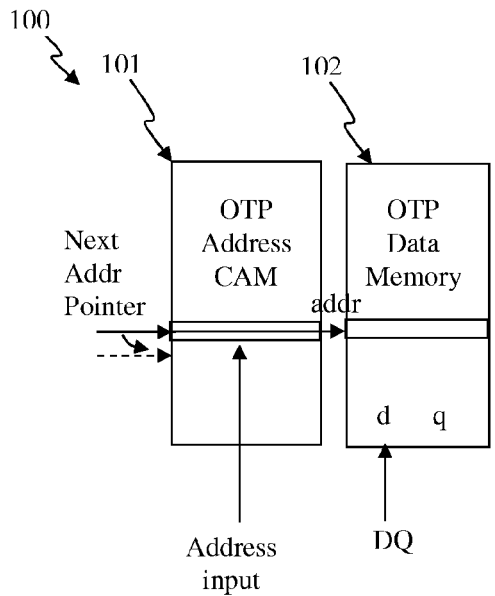
FIG. 2(a) shows a block diagram of an OTP-for-MTP in a program operation according to one embodiment.

FIG. 2(a) shows a block diagram to indicate a program operation in an OTP-for-MTP memory 100 according to one embodiment. The OTP-for-MTP memory 100 has an OTP address CAM (Content Addressable Memory) 101 to store the addresses and an OTP data memory 102 to store the input data during programming. The OTP address CAM 101 has a pointer to indicate the next available entry for programming. When programming into the OTP-for-MTP memory 100, the input address and data are programmed into the address CAM 101 and the OTP data memory 102, respectively. The next entry pointer is updated subsequently.

Figure 2B:
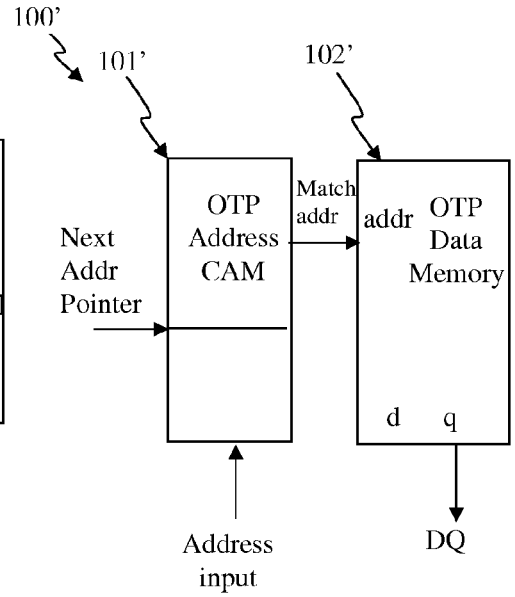
FIG. 2(b) shows a block diagram of an OTP-for-MTP in a read operation according to one embodiment.

FIG. 2(b) shows a block diagram to indicate a read operation in an OTP-for-MTP memory 100' according to one embodiment. The OTP-for-MTP memory 100' has an OTP address CAM (Content Addressable Memory) 101' to store the addresses and an OTP data memory 102' to store the associated data. The OTP address CAM 101' has a new entry pointer to differentiate between filled and empty entries. When reading the OTP-for-MTP memory 100', the input address is used to search among the filled entries in the OTP Address CAM 101' that match the input address, and to find the latest match if there are multiple matches. The latest match address is used to access the OTP Data Memory 102' for an output DQ. If no match is found, a word of all virgin state will be output to DQ.

Figure 2C:
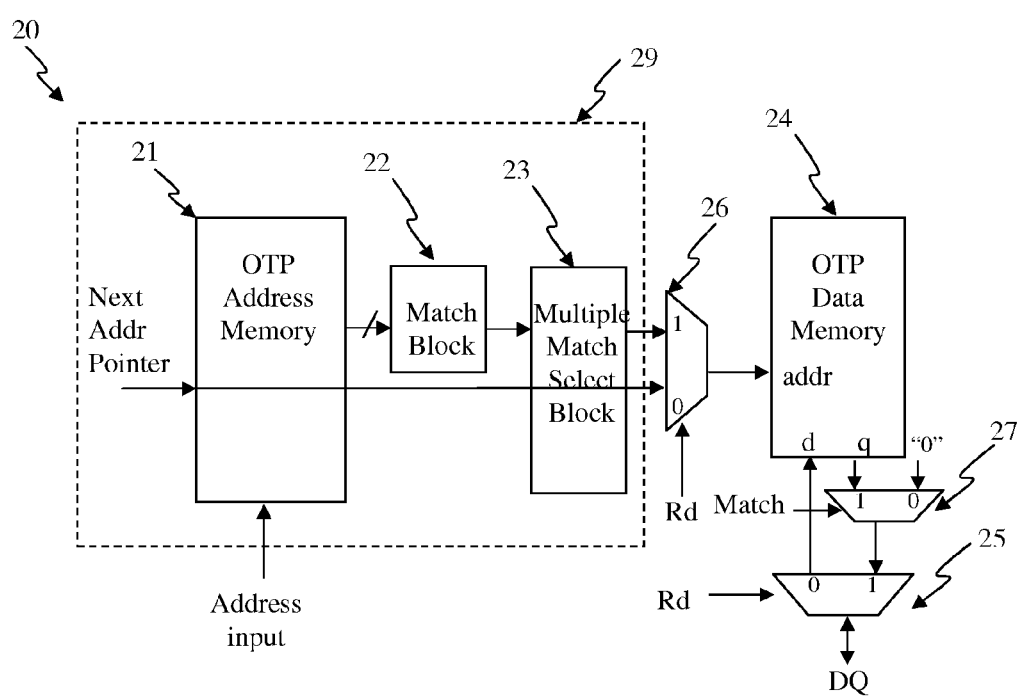
FIG. 2(c) shows a diagram of a portion of an OTP-for-MTP memory according to one embodiment.

FIG. 2(c) illustrates a diagram of a portion of an OTP-for-MTP memory 20 according to one embodiment. The OTP-for-MTP memory 20 has an OTP Address CAM 29, an OTP Data Memory 24, and several address, data, or I/O multiplexers 26, 27 and 25. The OTP Address CAM 29 can include an OTP Address Memory 21, a match block 22, and a multiple match select block 23 to store the input addresses, to match the input address in the OTP Address Memory 21, and to resolve multiple matches if any, respectively. The match block 22 is coupled to the OTP Address Memory 21 to find any address matched, and is coupled to the multiple match select block 23 to resolve any multiple matches. The OTP Data Memory 24 is to store the actual data that is programmed and read. The address multiplexer 26 is to multiplex between input address and the latest match address for programming and reading, respectively, as an address to the OTP Data Memory 24. The multiplex 25 is an I/O multiplexer to multiplex between input or output data for program or read, respectively. The multiplexer 27 is a match/non-match multiplexer to output the data in the OTP Data Memory if match or a word of all virgin state if non-match happens.

When programming the OTP-for-MTP memory 20, both the address and data are programmed into a new entry of the OTP address memory 21 and the OTP data memory 24, respectively. The next new entry pointer is updated in a predetermined order. When reading the OTP-for-MTP memory 20, the input address is checked against all addresses stored in the OTP address memory 21 by the match block 22. The match block 22 sends all entries of the valid matched addresses to the multiple-match select block 23 to find the latest entry. Then, the latest entry is used as an address to access data in the OTP data memory 24 that is to be output. If no matches are found, all bits with a virgin state will be output through the output multiplexer 25.

Figure 3A:
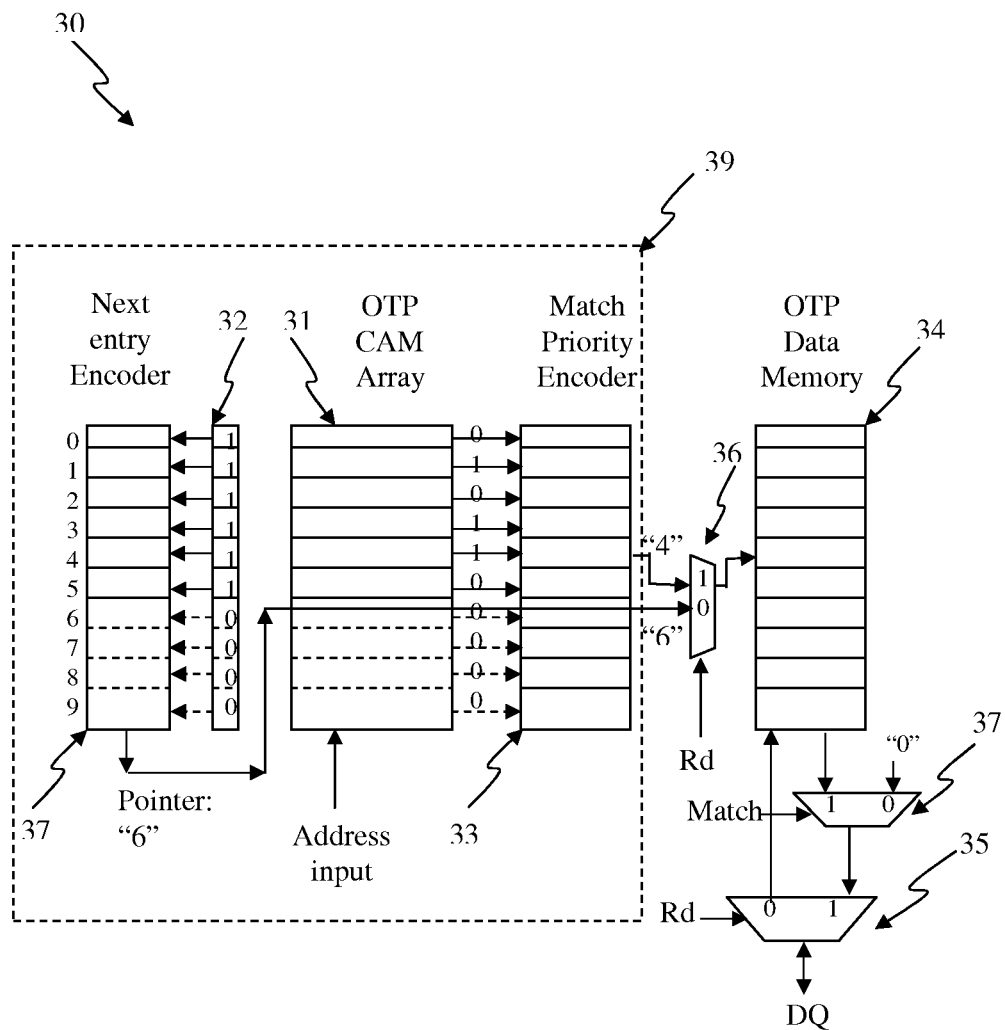
FIG. 3(a) shows a block diagram of a portion of an OTP-for-MTP memory according to one embodiment.

FIG. 3(a) shows a block diagram of a portion of an OTP-for-MTP memory 30 according to one embodiment. The OTP-for-MTP memory 30 has an OTP Address CAM 39, an OTP Data Memory 34, and address, data, or I/O multiplexers 36, 37 and 35, respectively. The OTP Content Addressable Memory 39 can include an OTP CAM Array 31, a valid-bit memory 32, a Next Entry Encoder 37, and a Match Priority Encoder 33. The OTP CAM Array 31 has a plurality of entries that can be programmed only once and can be used to search the stored contents with the input address and to output entry numbers, if any, that match. The OTP valid-bit memory 32 has a plurality of entries that can be programmed only once to indicate the validity of the entries. For example, the entries 0 through 5 in FIG. 3(a) are marked as "1" as being programmed, which means these entries in the OTP CAM Array 31 and OTP Data Memory 34 contain valid information. The Next Entry Encoder 37 can be used to determine the next new entry number, i.e. "6", based on valid bits. The easiest way to determine the next new entry is to search through the entry number increasingly or decreasingly until the first un-programmed valid bit is found. For example, the next available entry can be "6," since the entries 0 through 5 have been used. This can be achieved by using a priority encoder (or leading 1/0 detector) to detect the location of a first "1/0" after searching a long string of "0s" or "1s." The Match Priority Encoder 33 accepts all match addresses from the OTP CAM Array 31 to determine the latest entry of the match addresses, for example, the highest entry number of the match address. The Match Priority Encoder 33 can be embodied as another priority encoder based on the match line outputs from the OTP CAM Array 31, such as finding the first "1" from left to right in the string "0101100000" of match lines as shown in FIG. 3(a). The first "1" is found at entry "4." The latest entry number (i.e., 4) can be used as an address to access the OTP Data Memory 34 through a read/write multiplexer 36. The data accessed from the OTP Data Memory 34 can be used as an output DQ through the I/O multiplexer 35 (or output multiplexer) if any match occurs; otherwise all bits in virgin state will be outputted through the data multiplex 37.

Figure 3B:
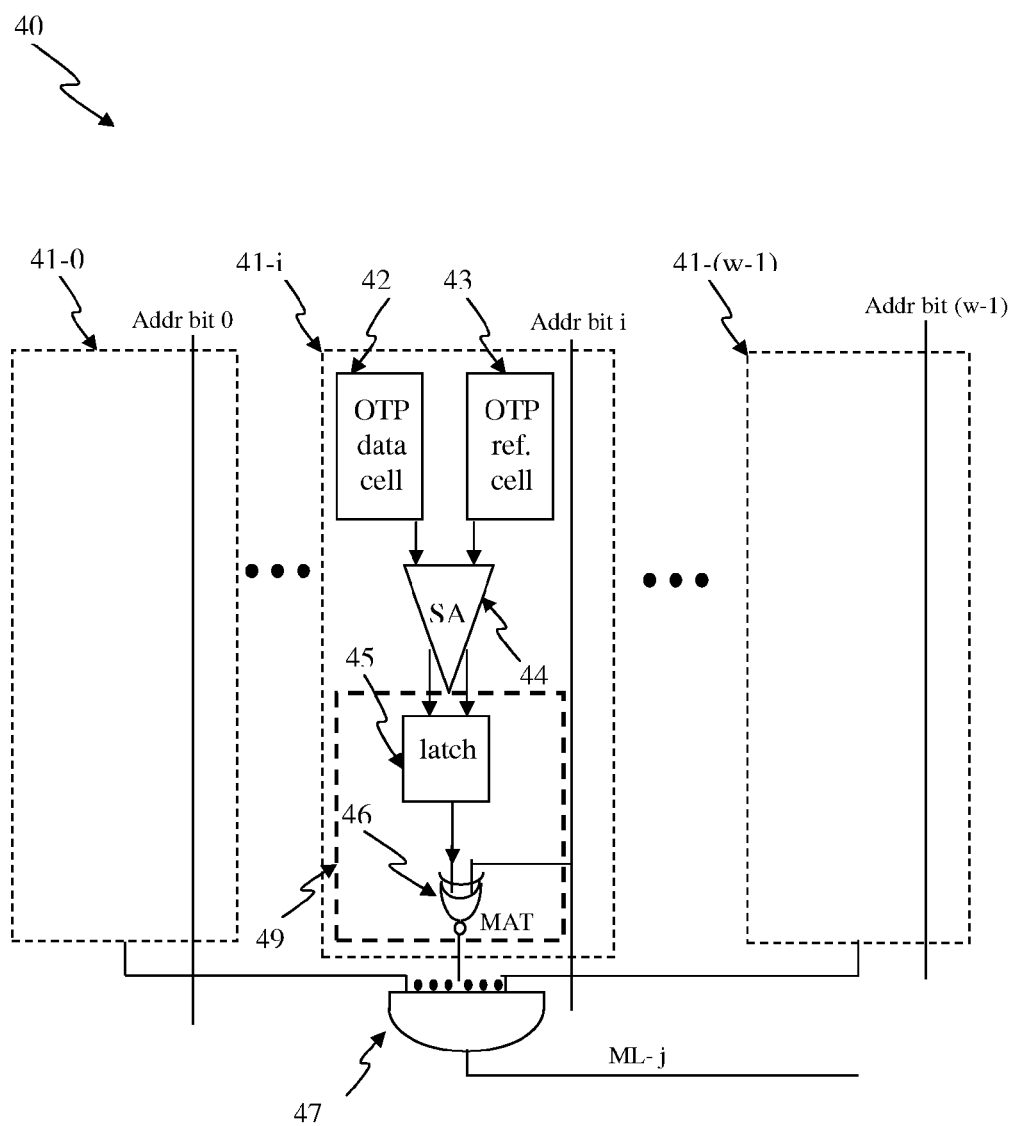
FIG. 3(b) shows a logic block diagram of a portion of a row in the OTP Content-Addressable Memory (CAM) according to one embodiment.

FIG. 3(b) shows a block diagram of a portion of a row 40 in an OTP CAM Array in FIG. 3(a) according to one embodiment. The row 40 is a logic implementation of a row in the OTP CAM Array 31 in FIG. 3(a). A row of the OTP CAM Array 40 has w cells 41-0 through 41-(w−1) for a w-bit word to store addresses. Each cell 41-$i$ ($i$=0, 1, 2, ..., w−1) has an OTP unit that contains an OTP data cell 42, an OTP reference cell 43, a sense amplifier 44, and a CAM unit 49 that contains a latch 45 and an XNOR 46. The XNOR 46 compares the data stored in the latch 45 with the incoming address bit to output a MAT: "1" if the data are the same or "0" if not. The MAT of each cell in the same row is AND'd to output a match line ML-j, for the jth row.

Figure 3C:
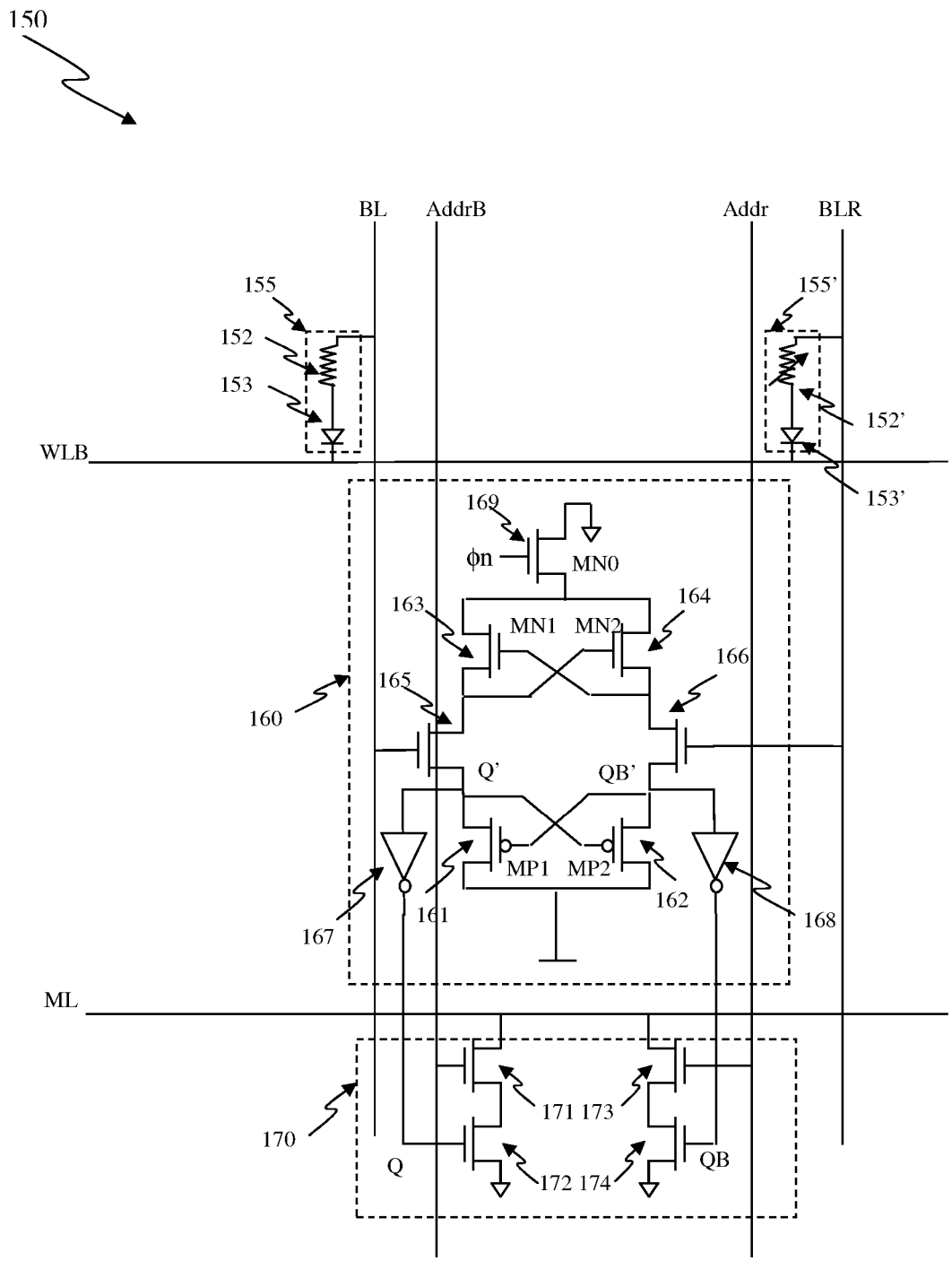
FIG. 3(c) shows a circuit block diagram of a portion of a cell in one OTP CAM according to one embodiment.

FIG. 3(c) shows a block diagram of a portion of an OTP CAM cell 150 according to one embodiment. The cell 150 in FIG. 3(c) is a circuit implementation of the cell 40-i in FIG. 3(b). An OTP data cell 155, corresponding to the OTP data cell 42 in FIG. 3(b), that has an OTP element 152 coupled to a diode 153 as a selector. One end of the OTP element 152 is coupled to a bitline (BL) and the other end coupled to a wordline bar (WLB). An OTP reference cell 155', corresponding to the OTP reference cell 43 in FIG. 3(b), that has an OTP reference element 152' coupled to a diode 153' as a selector. One end of the reference OTP element 152' is coupled to a reference bitline (BLR) and the other end coupled to the same wordline bar (WLB). A sense amplifier 160 that corresponds to the sense amplifier 44 in FIG. 3(b). The sense amplifier 160 has a pair of PMOS 161 and 162 with their gates and drains cross-coupled and their sources coupled to a supply voltage. The drains of the PMOS Q' and QB' are coupled to the drains of NMOS 165 and 166, respectively. The gates of the NMOS 165 and 166 are coupled to BL and BLR, respectively. The sources of the NMOS 165 and 166 are coupled to the drains of the NMOS 163 and 164, respectively. The gate of NMOS 163 is coupled to the drain of the NMOS 164, and the gate of NMOS 164 is coupled to the drain of NMOS 163. The sources of the NMOS 163 and 164 are coupled to the drain of an NMOS 169. The gate of the NMOS 169 is coupled to a sensing control signal φn the source is coupled to the ground. The drains of the PMOS 161 and 162 are coupled to the inputs of two inverters 167 and 168, respectively. The outputs of the inverters 167 and 168 Q and QB are the output of the sense amplifier 160. An exclusive NOR (XNOR) 170, part of a wired OR'd match line (ML) in the cell 150, that has two pairs of NMOS devices in serial with their gates coupled to Q and AddrB in one pair and QB and Addr in the other pair. The two pairs of NMOS in serial have one end coupled to ground and the other ends coupled to a match line (ML) common to all cells in the same row.

The OTP data cell 42 or the reference cells 43 in FIG. 3(b) are all OTP cells that can have an OTP element coupled to at least one program selector. The OTP element can be an electrical fuse or anti-fuse, depending if the programmed state has higher or lower resistance than that of the virgin state. The program selector can be a MOS or diode. The electrical fuse element can be an interconnect that consists at least a portion of the polysilicon, silicided polysilicon, silicide, polymetal, local interconnect, thermally isolated active region, metal, metal alloy, MOS gate, or combination thereof. The electrical fuse element can also be a single or a plural of contact or via. The anti-fuse can be a dielectric breakdown anti-fuse with a thin layer of dielectric between electrodes or in a contact/via hole. Alternatively, the anti-fuse can be a gate-oxide breakdown anti-fuse by breaking down the thin oxide in a MOS gate. The OTP reference cell is more desirable to be built with the same material or structure as the OTP data cell for better device matches during sensing. The sense amplifier 160 is a latch-type of sense amplifier that can sense a small differential signal developed between BL and BLR by asserting the signal φn when the BL and BLR pull-up devices (not shown in FIG. 3(c)) are turned on. 170 is a pass-gate implementation of XNOR between the output Q/QB of the sense amplifier 160 and the Addr/AddrB input. The output ML of the XNOR 170 is coupled to the same ML for those cells in the same row.

There are many varieties and equivalent embodiments of OTP data/reference cells, sense amplifier, or XNOR circuit in FIG. 3(c). For example, the OTP cell can have a MOS as selector, though a diode is a more desirable embodiment. The input MOS devices 165 and 166 of the sense amplifier 160 can be placed near the supply voltage or ground instead of placed between N-latch and P-latch as shown in FIG. 3(c). The pair of the inverter 167 and 168 may be omitted in other embodiments. There can be many different latch types of sense amplifiers. The XNOR circuit 170 can be embodied in combinational logic, instead of a domino logic as shown in FIG. 3(c). The MOS in FIG. 3(c) can be either NMOS or PMOS. For those skilled in the art understand that the above descriptions are for illustrative purposes and there are many various and equivalent embodiments that are still within the scope of this invention.

Figure 4A:
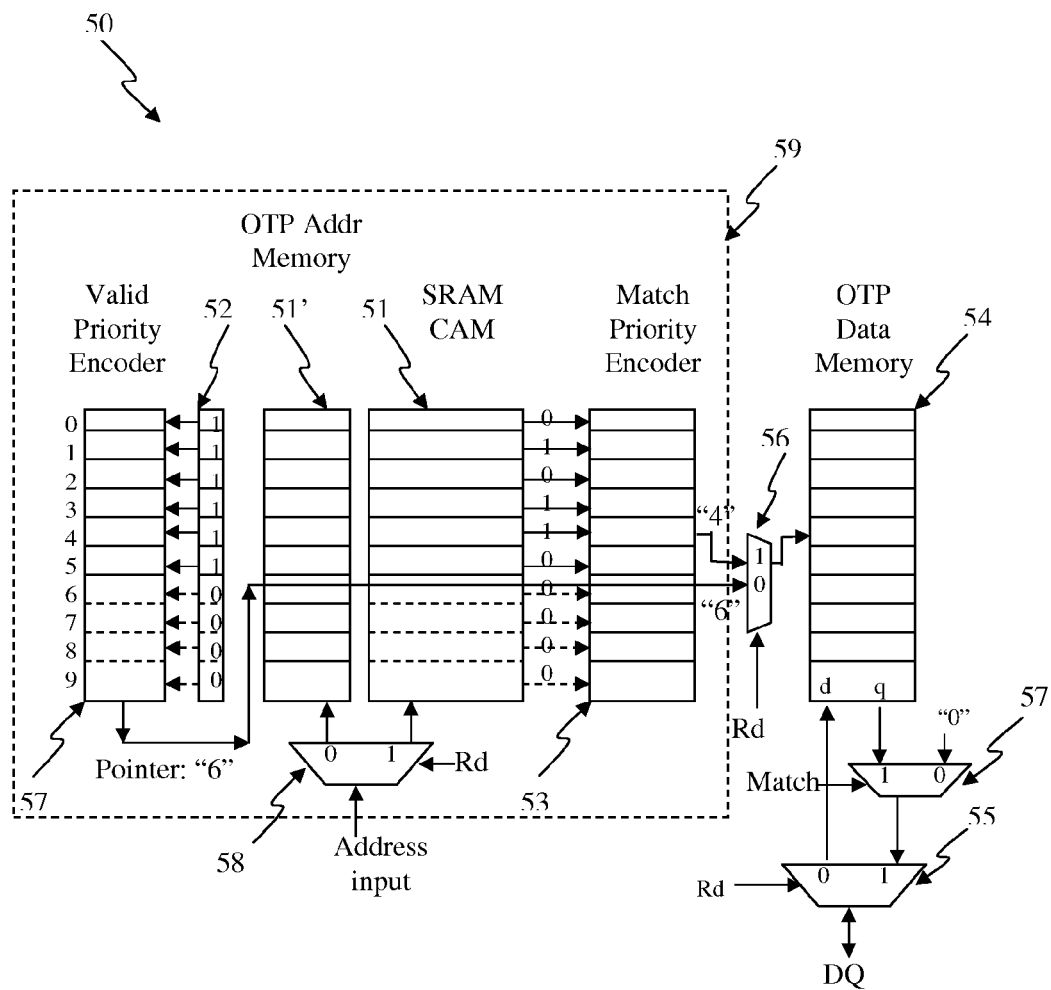
FIG. 4(a) shows a block diagram of a portion of an OTP-for-MTP memory functional block according to another embodiment.

FIG. 4(a) shows a block diagram of a portion of an OTP-for-MTP memory 50 according to one embodiment. The OTP-for-MTP memory 50 has at least one OTP Address CAM 59, an OTP Data Memory 54, and several address, data, and I/O multiplexers 56, 57 and 55, respectively. The OTP Address CAM 59 has at least an OTP Address Memory 51', at least one SRAM CAM 51, at least one OTP valid-bit memory 52, a Valid Priority Encoder 57, and a Match Priority Encoder 53. The OTP Address Memory 51', the SRAM CAM 51, the OTP Data Memory 54, and the OTP valid-bit memory 52 all have a plurality of entries to store non-volatile addresses, volatile addresses for comparison, data, and valid bits, respectively. The SRAM CAM 51 can be loaded with the addresses from the OTP address memory 51', which can be used to compare with any input address and output the latest entry number, if any, that matches. Both the OTP address memory 51' and the SRAM CAM 51 can be updated during programming. But only the SRAM CAM 51 can be used for comparing with the input address during reading. The OTP valid-bit memory 52 stores valid bits to indicate the validity of each entry. For example, the entries 0 through 5 in FIG. 4(a) are marked as "1", programmed state, which means these entries in the Match Address Memory 51' and OTP Data Memory 54 contain valid information. A valid Priority Encoder 53 can be used to determine the next new entry number, i.e. "6." The easiest way to determine the next new entry is to search in increasing or decreasing order through all the entries. For example, the next available entry can be "6," since the entries 0 through 5 have been used. This can be achieved by using a priority encoder, or leading 1/0 detector, to detect the location of a first "1/0" after searching a long string of "0s" or "1s." The Match Priority Encoder 53 can accept all match addresses from the SRAM CAM 51 to determine the latest entry of the match addresses, i.e. the match address stored in the highest entry if the next new entry is incremented. The Match Priority Encoder 53 can be embodied as another priority encoder based on the match line outputs, such as "0101100000" from entries 0 to 9. In FIG. 4(a), the match outputs are searched from entry 9 through 0 until the first "1" is found at entry "4." The latest entry number (i.e., 4) can be used as an address to access the OTP Data Memory 54 through a read/write address multiplexer 56. The data accessed from the OTP Data Memory 54 can be used as an output DQ through an I/O multiplexer 55 if any match occurs; otherwise, all bits in the virgin state will be outputted through the data multiplex 57.

Figure 4B:
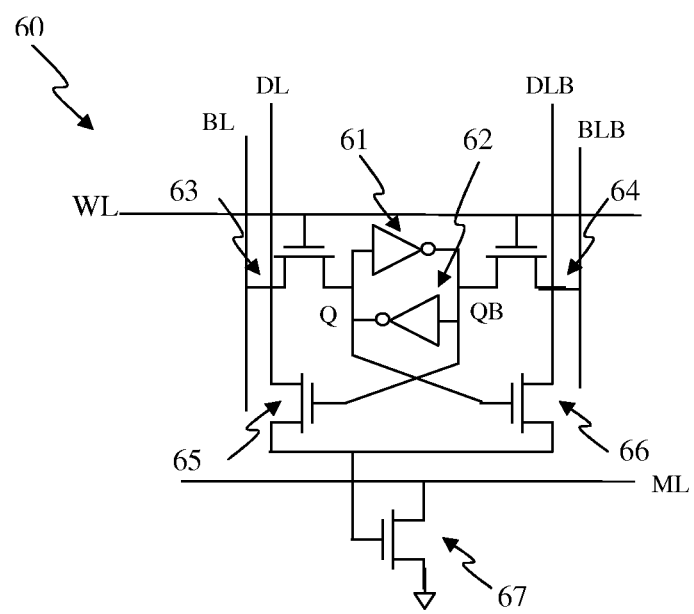
FIG. 4(b) shows a circuit diagram of a CAM cell in the SRAM CAM memory of FIG. 4(a) according to one embodiment.

FIG. 4(b) shows a circuit diagram of a SRAM CAM cell 60 corresponding to the memory cells of the SRAM CAM 51 in FIG. 4(a), according to one embodiment. The SRAM CAM cell 60 has an SRAM core that consists of a pair of cross-coupled inverters 61 and 62 and a pair of NMOS pass gates 63 and 64. The two nodes Q and QB of the cross-coupled inverters 61 and 62 are coupled to the sources of NMOS 63 and 64, respectively. The gates of the NMOS 63 and 64 are coupled to a wordline (WL). The drains of NMOS 63 and 64 are coupled to BL and BLB, respectively. The sources/gates of NMOS 65 and 66 are coupled to DL/QB and DLB/Q, respectively. The drains of the NMOS 65 and 66 are coupled to the gate of NMOS 67, whose source is coupled to ground and drain is coupled to a match line (ML).

A priority encoder is to detect the location of a first 0 or 1 in a string of binaries. For example, a string as shown in the following:

| bit 0 | bit 1 | bit 2 | bit 3 | bit 4 | bit 5 | bit 6 | bit 7 | bit 8 | bit 9 | bit 10 | bit 11 |
|---|---|---|---|---|---|---|---|---|---|---|---|
| 0 | 0 | 0 | 0 | 1 | 0 | 1 | 1 | 1 | 0 | 1 | 1 |

A priority encoder to find the first 1 from bit 0 to bit 11 will output a "4" in decimal, or "100" in binary. There are many embodiments available for priority encoders. See, e.g., U.S. Pat. No. 5,383,142 for additional information on detecting bit patterns, which is hereby incorporated as a reference.

The OTP valid-bit memory 32 in FIG. 3(*a*) or the OTP valid-bit memory 52 in FIG. 4(*a*) can have an additional disable bit per entry. When a disable bit is programmed, the information in same entry in the OTP CAM unit and the OTP Data Memory will not be used, no matter whether the valid bit is programmed or not. The disable bit can be programmed any time while the OTP-for-MTP memory is active or when the chip is enabled or powering up. This provides a mechanism to simplify multiple match resolution and/or to abandon an entry if any bits in the OTP CAM unit or OTP data memory are defective.

Figure 5A:
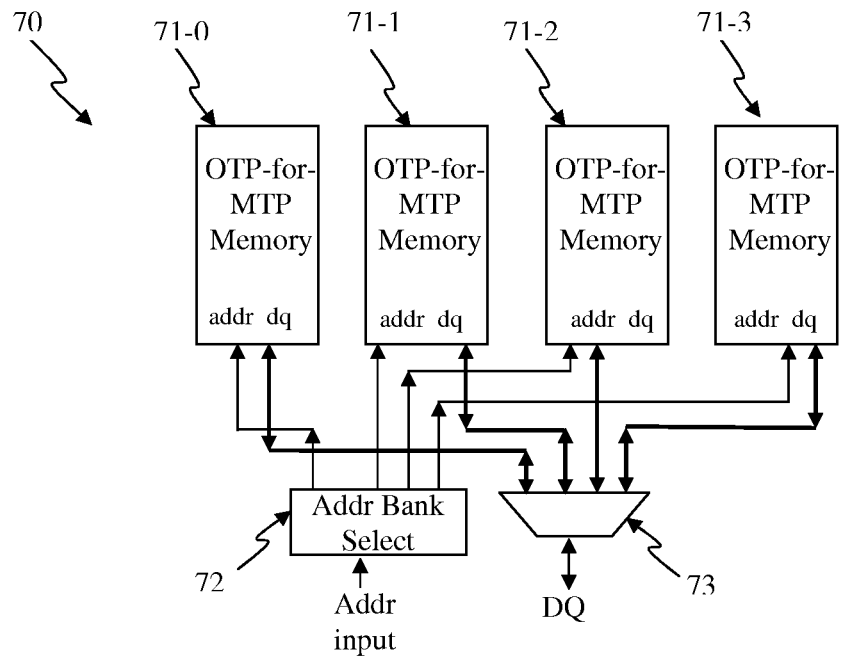
FIG. 5(a) shows a block diagram of a portion of multiple segment OTP-for-MTP memory according to one embodiment.
Figure 5B:
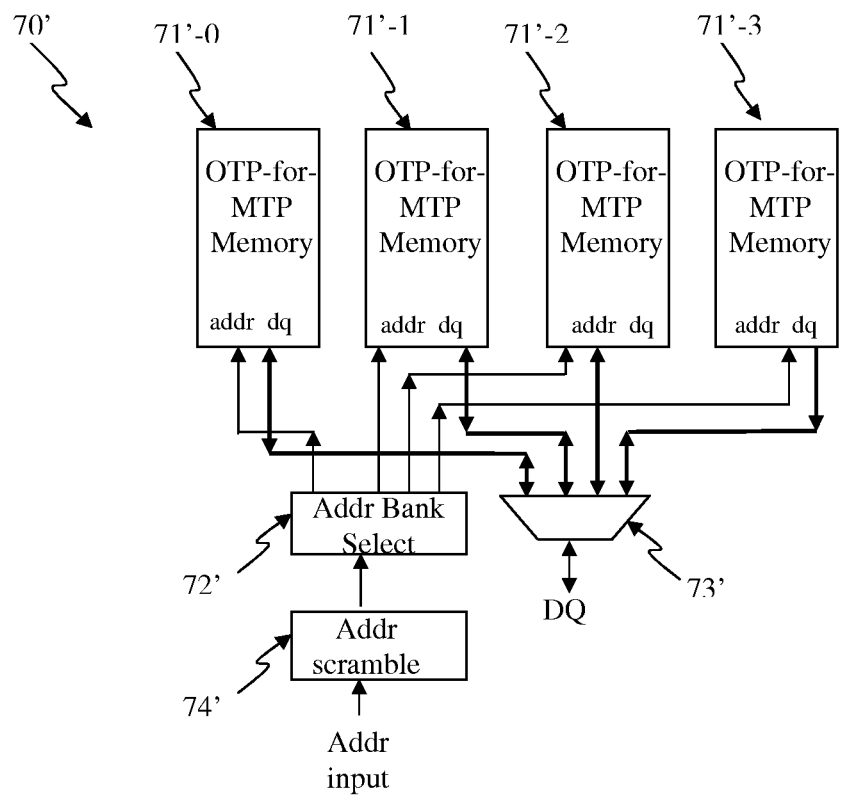
FIG. 5(b) shows a block diagram of a portion of multiple segment OTP-for-MTP memory with address scramble block according to another embodiment.

FIG. 5(*a*) shows a block diagram of a portion of multiple segment OTP-for-MTP memory 70 according to one embodiment. The multiple segment OTP-for-MTP 70 has a plurality of OTP-for-MTP memories 71-0 through 71-3, corresponding to the OTP-for-MTP memory 30 in FIG. 3(*a*) or the OTP-for-MTP memory 50 in FIG. 4(*a*), with each OTP-for-MTP memory responsible for certain address ranges. For example, if the OTP-for-MTP memory 70 has 1 Kb of address, the OTP-for-MTP memories 71-0, 71-1, 71-2 and 71-3 are responsible for addresses 0-255, 256-511, 512-767 and 768-1023, respectively. Any address input to the OTP-for-MTP memory 70 will be routed into the proper OTP-for-MTP memory 71-0 through 71-3 based on the address ranges by an address bank select block 72. Similarly, the data input/output DQ can be routed to the DQ of the suitable OTP-for-MTP memory 71-0 through 71-3 by a multiplexer 73.

In another embodiment, addresses to each OTP-for-MTP can be assigned based on the address modulus to the number of banks. For example, OTP-for-MTP memories 71-0, 71-1, 71-2 and 71-3 can be assigned for those addresses that are 4 m+0, 4 m+1, 4 m+2, and 4 m+3, respectively, where m=0, 1, 2, 3, 4 . . . . This embodiment can divide the OTP-for-MTP memory into several smaller memories so that the speed can be faster and the overhead can be lower.

FIG. 5(*b*) shows a block diagram of a portion of multiple segment OTP-for-MTP memory 70' according to one embodiment. This embodiment is similar to that in FIG. 5(*a*) except an additional address scramble block 74' is included to spread the input address among different segments of OTP-for-MTP memories. The multiple segment OTP-for-MTP 70' has an input address scramble unit 74' and a plurality of OTP-for-MTP memory 71'-0 through 71'-3, corresponding to the OTP-for-MTP memory 30 in FIG. 3(*a*) or the OTP-for-MTP memory 50 in FIG. 4(*a*), with each OTP-for-MTP memory responsible for certain address ranges. For example, if the OTP-for-MTP memory 70' has 1 Kb of address, the OTP-for-MTP memories 71'-0, 71'1, 71'-2 and 71'-3 are responsible for address ranges 0-255, 256-511, 512-767 and 768-1023, respectively. Any address input to the OTP-for-MTP memory 70' will be routed into the proper OTP-for-MTP memories 71'-0 through 71'-3 based on the address ranges by an address bank select block 72'. Similarly, the data input/output DQ can be routed to the DQ of the suitable OTP-for-MTP memory 71'-0 through 71'-3 by a multiplexer 73'.

In another embodiment, addresses to each OTP-for-MTP can be assigned based on the address modulus to the number of banks. For example, OTP-for-MTP memories 71'-0, 71'-1, 71'-2 and 71'-3 can be assigned for those addresses that are 4 m+0, 4 m+1, 4 m+2, and 4 m+3, respectively, where m=0, 1, 2, 3, 4 . . . . This embodiment can divide the OTP-for-MTP memory into several smaller memories so that the speed can be faster and the overhead can be lower. The address scramble unit 74' can make each OTP-for-MTP memory's entries filled up more uniformly.

Those skilled in the art understand that the above discussions are for illustrative purposes and that there are many variations and equivalents in constructing OTP memory such as electrical fuse or anti-fuse, OTP CAM cell or SRAM CAM cell, priority encoder, sense amplifier, or exclusive NOR and that are all within the scope of this invention.

Figure 6:
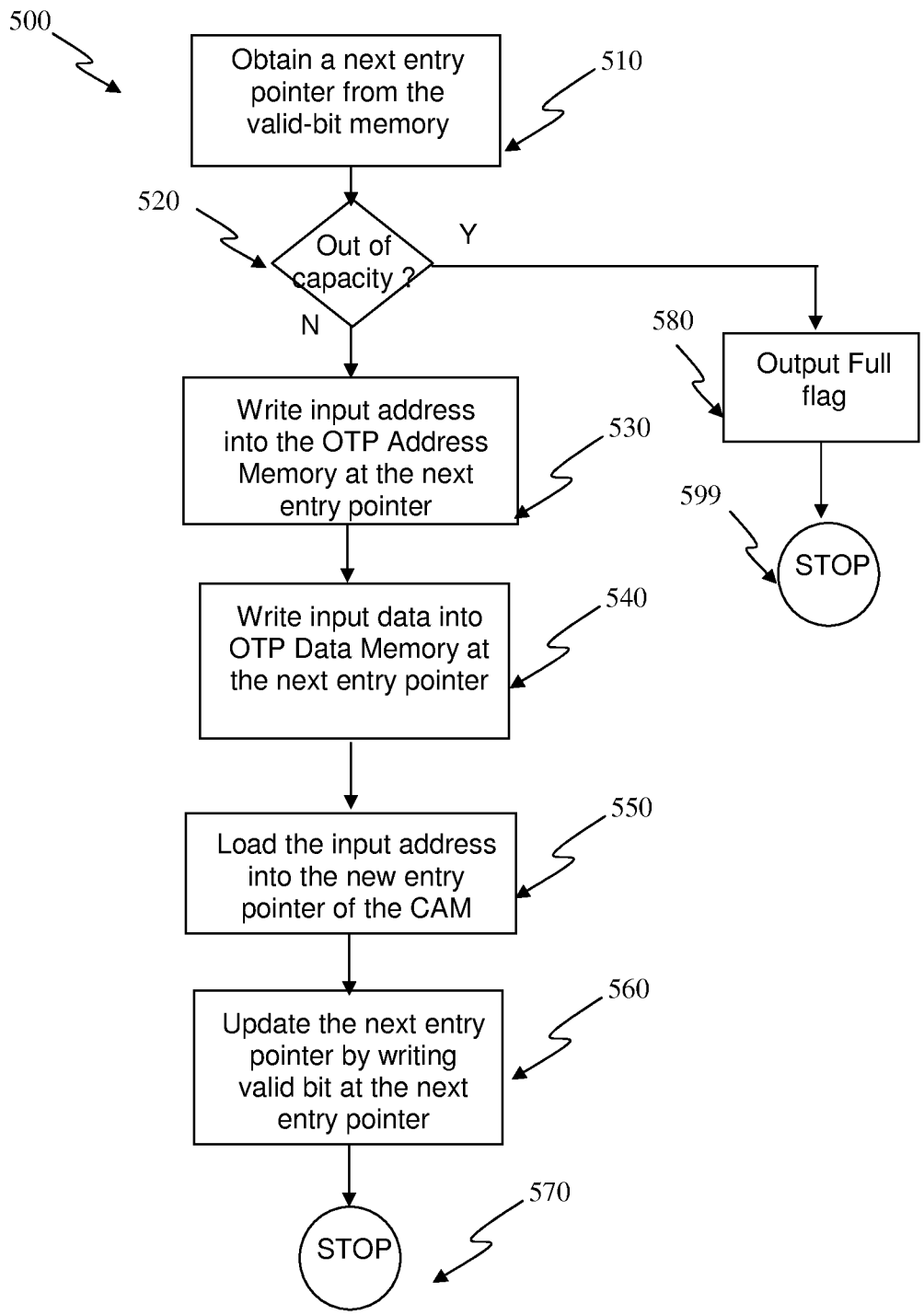
FIG. 6 depicts a method in a flow chart to program an OTP-for-MTP memory according to one embodiment.

FIG. 6 shows a flow chart 500 depicting a method for programming data into an OTP-for-MTP memory as shown in FIGS. 2, 3(*a*)-3(*c*) and 4(*a*), according to one embodiment. The procedure starts at 510 to generate a next entry pointer by using valid bits in a OTP valid memory. Then, check if the next entry pointer is out of the memory capacity in step 520. If so, output an error signal in step 580 and stop in step 599. If not, write an input address at the next entry pointer of an OTP Address Memory in step 530. Next, write input data at the next entry pointer of an OTP Data Memory in step 540. The input address can then be loaded to the new entry pointer of a Content Addressable Memory (CAM). For example, the cells in the SRAM CAM 51 in FIG. 4(*a*) can also be updated at the new entry pointer in step 550 so that the CAM and the OTP Address Memory are synchronized. Further, a valid bit can be written at the next entry pointer of the OTP valid memory in step 560. This procedure stops in step 570 if no further data are to be written into the OTP-for-MTP memory.

Figure 7:
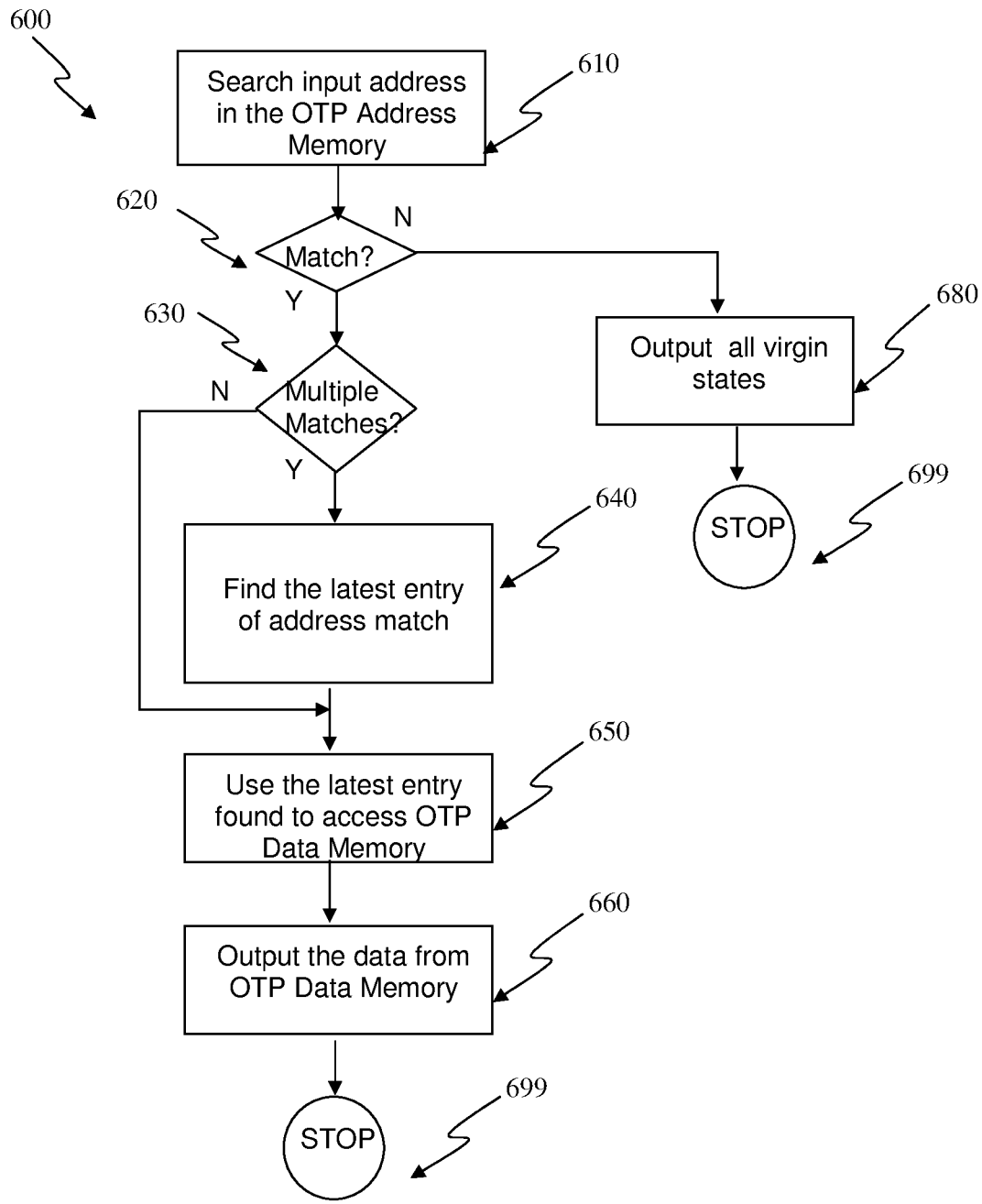
FIG. 7 depicts a method in a flow chart to read an OTP-for-MTP memory according to one embodiment.

FIG. 7 shows a flow chart 600 depicting a method for reading data in an OTP-for-MTP memory, according to one embodiment. The procedure starts at 610 to search if any addresses stored in the OTP address memory match an input address. At step 620, the procedure checks if a match is found. If there is no match, output all bits with the virgin state in step 680 and then stop in step 699. If there is a match in step 620, further check if there are multiple matches in step 630. If no multiple matches, go ahead to use the entry of the valid matched address to access an OTP data memory in step 650. If there are multiple matches, find the latest entry of the valid matched address by following the entry update order in step 640. In one embodiment, the latest entry can be the highest entry number of the valid matched addresses, if addresses and data are filled in increment order. The entry of the only valid matched address or the latest valid matched address can be used to access the OTP data memory in step 650. Then, output the data accessed from the OTP Data Memory in step 660 and stop in step 699.

FIGS. 6 and 7 illustrate flow charts depicting embodiments of programming data into an OTP-for-MTP memory and reading data from an OTP-for-MTP memory, respectively, in accordance with certain embodiments. The methods 500 and 600 are described in the context of an OTP-for-MTP memory, such as the OTP-for-MTP memory 100, 100' and 20 in FIGS. 2(a), 2(b) and 2(c), respectively, the OTP-for-MTP memory 30 in FIG. 3(a), or the OTP-for-MTP memory 50 in FIG. 4(a). In addition, although described as a flow of steps, one of ordinary skilled in the art will recognize that at least some of the steps may be performed in a different order, including simultaneously, or skipped.

Figure 8:
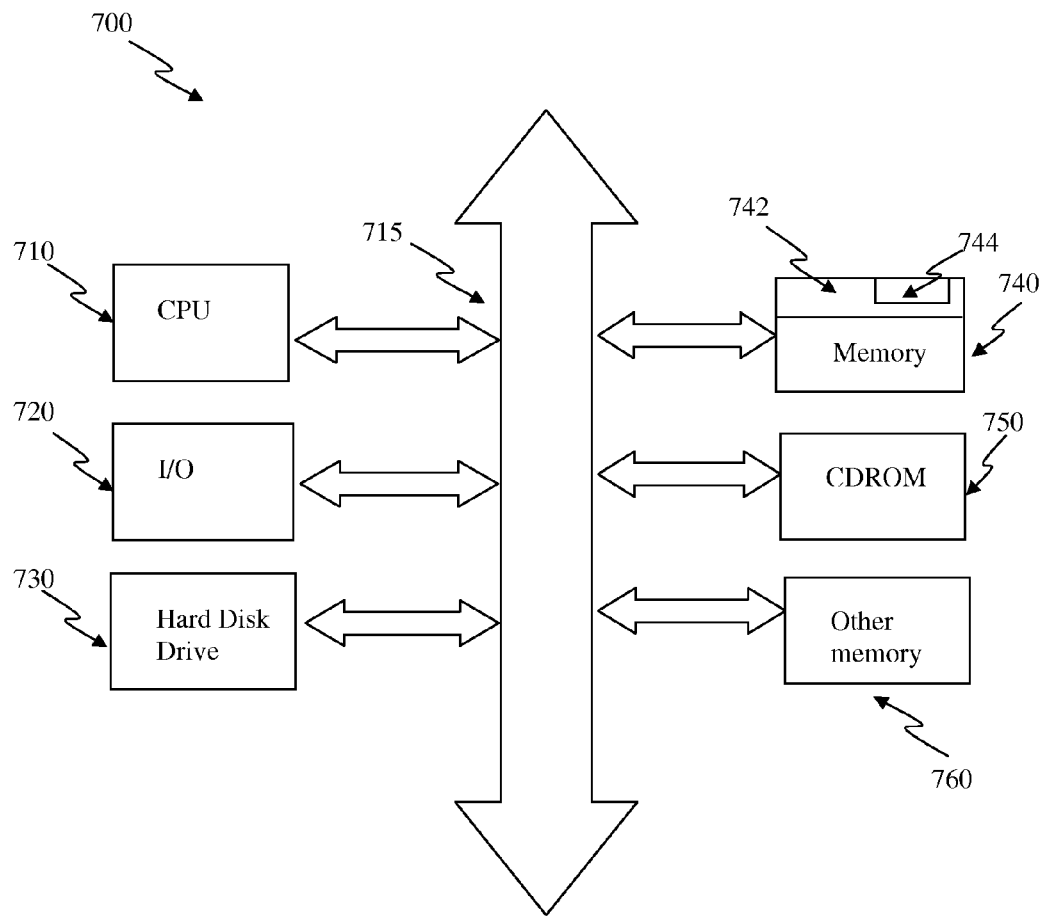
FIG. 8 shows an electronic system using at least one OTP-for-MTP memory.

FIG. 8 shows a processor system 700 according to one embodiment. The processor system 700 can include an OTP device 744, such as in an OTP cell array 742, in at least one OTP-for-MTP memory 740, according to one embodiment. The processor system 700 can, for example, pertain to an electronic system. The electronic system can include a Central Process Unit (CPU) 710, which communicate through a common bus 715 to various memory and peripheral devices such as I/O 720, hard disk drive 730, CDROM 750, OTP-for-MTP memory 740, and other memory 760. Other memory 760 is a conventional memory such as SRAM, DRAM, or flash, typically interfaces to CPU 710 through a memory controller. CPU 710 generally is a microprocessor, a digital signal processor, or other programmable digital logic devices. OTP-for-MTP memory 740 is preferably constructed as an OTP device 744. The OTP-for-MTP memory 740 typically interfaces to CPU 710 through a memory controller. If desired, the memory 740 may be combined with the processor, for example CPU 710, in a single integrated circuit.

The embodiments of invention can be implemented in a part or all of an integrated circuit in a Printed Circuit Board (PCB), or in a system (e.g., electronic system, computer system, memory system, etc.). The OTP device can be implemented as any electrical fuse or anti-fuse. An electrical fuse can be based on a segment of interconnect or a single or plural of contact/via. The anti-fuse can be based on breaking down a layer of dielectric between electrodes or in a contact/via hole, or breaking down a thin gate oxide of a MOS device.

Additional details on OTP devices can be found in: (i) U.S. patent application Ser. No. 13/214,183, filed on Aug. 20, 2011 and entitled "Method and System of Using One-Time Programmable Memory as Multi-Time Programmable in Code Memory of Processors," which is hereby incorporated herein by reference; (ii) U.S. patent application Ser. No. 13/471,704, filed on May 15, 2012 and entitled "Circuit and System of Using Junction Diode as Program Selector for One-Time Programmable Devices," which is hereby incorporated herein by reference; (iii) U.S. patent application Ser. No. 13/026,752, filed on Feb. 14, 2011 and entitled "Circuit and System of Using Junction Diode as Program Selector for One-Time Programmable Devices," which is hereby incorporated herein by reference; and (iv) U.S. patent application Ser. No. 13/026,656, filed on Feb. 14, 2011 and entitled "Circuit and System of Using Polysilicon Diode As Program Selector for One-Time Programmable Devices," which is hereby incorporated herein by reference.

The above description and drawings are only to be considered illustrative of exemplary embodiments, which achieve the features and advantages of certain embodiments of the present invention. Modifications and substitutions of specific process conditions and structures can be made without departing from the spirit and scope of the present invention.

The many features and advantages of the present invention are apparent from the written description and, thus, it is intended by the appended claims to cover all such features and advantages of the invention. Further, since numerous modifications and changes will readily occur to those skilled in the art, it is not desired to limit the invention to the exact construction and operation as illustrated and described. Hence, all suitable modifications and equivalents may be resorted to as falling within the scope of the invention.

What is claimed is:

1. A non-volatile memory, comprising:
    at least one One-Time Programmable (OTP) data memory that has a plurality of OTP memory cells to store data; and
    at least one OTP Content Addressable Memory (CAM) that has a plurality of OTP address memory cells to store valid addresses and a plurality of CAM memory cells to compare an input address with the valid addresses stored in the OTP address memory cells and to output a latest entry of the matched valid addresses,
    wherein the non-volatile memory is configured to be programmable multiple times on the same addresses by programming an address and data into a next available entry of the OTP CAM and the OTP data memory, respectively, and
    wherein the non-volatile memory is configured to be read by using the input address to search the latest entry of the matched valid addresses in the OTP CAM and then use that address to access the OTP data memory to read data for output.

2. A non-volatile memory as recited in claim 1, wherein the non-volatile memory comprises:
    at least one register to indicate the next available entry in the OTP data memory and the OTP CAM.

3. A non-volatile memory as recited in claim 1, wherein the OTP CAM has a plurality of OTP CAM cells, and wherein at least one of the OTP CAM cells has at least one OTP memory cell coupled to at least one volatile CAM cell.

4. A non-volatile memory as recited in claim 1, wherein the OTP CAM has at least one OTP address memory array to store addresses coupled to at least one volatile CAM memory array for address match and output the latest entry of the matched valid addresses.

5. A non-volatile memory as recited in claim 1, wherein the OTP CAM unit has at least one OTP valid-bit memory to store at least one valid bit per entry, and wherein the valid bit in the same entry is also programmed when programming an entry of the OTP CAM unit and the OTP data memory.

6. A non-volatile memory as recited in claim 5, wherein the OTP CAM unit has at least one OTP disable bit for each entry of the OTP valid-bit memory.

7. A non-volatile memory as recited in claim 5, wherein the OTP CAM unit has a circuit to generate a next available entry for the OTP CAM based on the valid bits.

8. A non-volatile memory as recited in claim 1, wherein the OTP CAM unit has a plurality of match lines for each entry that can be asserted when the contents of the valid entry match the input address.

9. A non-volatile memory as recited in claim 8, wherein the OTP CAM unit has a match priority encoder to find the latest entry of the match addresses among the asserted match lines.

10. A non-volatile memory as recited in claim 1, wherein the non-volatile memory only processes a portion of a total address range, and wherein other non-volatile memories to processes other portions of the total address ranges, whereby the full address range is constructed for the non-volatile memory.

11. A non-volatile memory as recited in claim 1, wherein the OTP memory has a plurality of OTP memory cells, and wherein at least one of the OTP memory cell is an electrical fuse or anti-fuse.

12. A non-volatile memory as recited in claim 11, wherein the electrical fuse cell includes at least a portion of polysilicon, silicided polysilicon, silicide, polymetal, local interconnect, metal, metal alloy, CMOS gate, or combination thereof.

13. A non-volatile memory as recited in claim 1, wherein the OTP memory has a plurality of OTP memory cells, and wherein at least one of the OTP memory cell has at least one diode as program selector.

14. An electronic system, comprising:
a processor; and
an MTP memory based on OTP memory operatively connected to the processor, the MTP memory comprising:
   an OTP data memory having a plurality of entries of OTP memory cells to provide data storage;
   an OTP Content Addressable Memory (CAM) having a plurality of entries of OTP memory cells and CAM cells to provide address storage and to search an input address among valid addresses stored in the OTP memory cells and to output a latest entry of the matched valid address; and
   at least one register to provide a next available entry in the OTP data memory and OTP CAM,
wherein the MTP memory is configured to be programmable by programming an address and data into the next available entry in the OTP CAM and the OTP data memory, respectively, and
wherein the MTP memory is configured to be read by searching an input address in the OTP CAM and providing the latest entry of the matched valid address to access the OTP data memory to read data for output.

15. An electronic system as recited in claim 14, wherein the OTP CAM has at least one OTP valid-bit memory to store at least one valid bit per entry, and wherein the valid bit of an entry is also programmed when programming the same entry in the OTP CAM and/or the OTP data memory.

16. An electronic system as recited in claim 15, wherein the OTP CAM has a circuit to generate a next available entry in the OTP CAM based on the valid bits.

17. A method of providing an MTP memory based on OTP memories, comprising:
   providing at least an OTP memory having a plurality of entries of OTP memory cells to store data;
   providing at least an OTP CAM having a plurality of entries of OTP memory cells to store valid addresses and a plurality of entries of CAM memory cells to compare an input address with valid addresses stored and outputting a latest entry of the matched valid addresses;
   finding the next available entry of the OTP data memory and OTP CAM;
   programming data and address into the next available entry of the OTP data and OTP CAM, respectively, when programming the MTP memory; and
   searching input address in all valid addresses stored in the OTP CAM to find the latest entry of the matched valid addresses to access the OTP data memory when reading the MTP memory.

18. A method as recited in claim 17, wherein the OTP CAM has a plurality of entries of OTP CAM cells, and wherein at least one of the OTP CAM cells has at least one OTP memory cell coupled to at least one volatile CAM cell.

19. A method as recited in claim 17, wherein the OTP CAM has at least one OTP address memory array to store addresses and at least one volatile CAM memory array for address match and output the latest entry of the matched valid addresses.

20. A method as recited in claim 17, wherein the searching to find the latest entry of the matched valid addresses comprises:
   (i) comparing the valid contents of the OTP CAM with the input address bit-by-bit for each entry;
   (ii) asserting a match line for each valid entry if the content matches the input address; and
   (iii) finding the latest entry among the asserted match lines.

21. A method as recited in claim 20, wherein the searching to find the next available entry in the OTP CAM and the OTP data memory comprises:
   (i) providing at least one valid bit for each entry of the OTP CAM and the OTP data memory;
   (ii) programming the valid bit in the same entry after programming an entry of the OTP CAM and OTP data memory; and
   (iii) finding the next entry with the valid bit un-programmed in the entry update order.

* * * * *